US010638581B2

(12) United States Patent
Takagi et al.

(10) Patent No.: US 10,638,581 B2
(45) Date of Patent: Apr. 28, 2020

(54) LIGHT-EMITTING/RECEIVING DEVICE AND LIGHT-DETECTING METHOD

(71) Applicant: ASAHI KASEI MICRODEVICES CORPORATION, Tokyo (JP)

(72) Inventors: Yuta Takagi, Tokyo (JP); Yuji Goda, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/227,316

(22) Filed: Dec. 20, 2018

(65) Prior Publication Data

US 2019/0124738 A1 Apr. 25, 2019

Related U.S. Application Data

(63) Continuation of application No. PCT/JP2017/023087, filed on Jun. 22, 2017.

(30) Foreign Application Priority Data

Jun. 24, 2016 (JP) .................................. 2016-125710

(51) Int. Cl.
*H01L 33/00* (2010.01)
*H05B 45/40* (2020.01)
*H01L 27/15* (2006.01)
(Continued)

(52) U.S. Cl.
CPC ........... *H05B 45/40* (2020.01); *H01L 25/167* (2013.01); *H01L 27/15* (2013.01);
(Continued)

(58) Field of Classification Search
CPC ..................... H01L 2924/1011; H01L 2924/12
(Continued)

(56) References Cited

U.S. PATENT DOCUMENTS 4,967,241 A * 10/1990 Kinoshita ............ G02B 6/4204
257/461
5,438,210 A 8/1995 Worley
(Continued)

FOREIGN PATENT DOCUMENTS

JP H08-018428 A 1/1996
JP H09-260720 A 10/1997
(Continued)

OTHER PUBLICATIONS

International Search Report dated Aug. 1, 2017, issued in corresponding International Patent Application No. PCT/JP2017/023087.

*Primary Examiner* — Thuy V Tran
(74) *Attorney, Agent, or Firm* — Morgan, Lewis & Bockius LLP

(57) ABSTRACT

A light-emitting/receiving device including: a diode-type light-emitting element formed on a semiconductor substrate; a diode-type light-receiving element formed on the semiconductor substrate; a light source driving unit configured to supply a first common voltage to an anode or a cathode of the light-emitting element to drive the light-emitting element; and a light signal processing unit configured to perform current/voltage conversion on an output current outputted from the light-receiving element, by referring to a second common voltage.

8 Claims, 10 Drawing Sheets

(51) Int. Cl.
*H01L 25/16* (2006.01)
*H01L 31/12* (2006.01)
*H05B 45/10* (2020.01)
*H01L 31/02* (2006.01)

(52) U.S. Cl.
CPC ........ *H01L 31/02019* (2013.01); *H01L 31/12* (2013.01); *H01L 31/125* (2013.01); *H05B 45/10* (2020.01); *H01L 2924/1011* (2013.01); *H01L 2924/12* (2013.01)

(58) Field of Classification Search
USPC .................................. 257/E21.001, E33.001
See application file for complete search history.

(56) References Cited

U.S. PATENT DOCUMENTS 6,154,298 A   11/2000  Tamagawa
2005/0006648 A1*  1/2005  Yamazaki ............... H01L 27/12 257/72
2007/0120044 A1   5/2007  Shimizu et al.
2014/0264392 A1*  9/2014  Okushiba .......... H01L 31/02019 257/84
2016/0231244 A1   8/2016  Camargo et al.
2016/0334272 A1   11/2016  Saito et al.

FOREIGN PATENT DOCUMENTS

| | | |
|---|---|---|
| JP | H09-284217 A | 10/1997 |
| JP | 2003-179549 A | 6/2003 |
| JP | 2007-157187 A | 6/2007 |
| JP | 2009-016677 A | 1/2009 |
| JP | 2010-153484 A | 7/2010 |
| JP | 2010-278239 A | 12/2010 |
| WO | 2014/136242 A1 | 9/2014 |
| WO | 2015/045411 A1 | 4/2015 |
| WO | 2015/105048 A1 | 7/2015 |

* cited by examiner

LIGHT-EMITTING/RECEIVING DEVICE AND LIGHT-DETECTING METHOD

CROSS-REFERENCE TO RELATED APPLICATIONS AND INCORPORATION BY REFERENCE

This application is a continuation application filed under 35 U.S.C. § 111(a) of International Patent Application No. PCT/JP2017/023087, filed Jun. 22, 2017, which claims the foreign priority benefit under 35 U.S.C. § 119 of Japanese Patent Application No. 2016-125710, filed Jun. 24, 2016, the contents of which are incorporated herein by reference.

BACKGROUND

Light-detecting devices including a light-emitting element and a light-receiving element on the same substrate are known (for example, WO 2015/045411, JP 2009-16677 A, and WO 2015/105048). Such light-detecting devices are expected to detect light accurately.

SUMMARY

According to an embodiment, there is provided a light-emitting/receiving device including: a diode-type light-emitting element formed on a semiconductor substrate; a diode-type light-receiving element formed on the semiconductor substrate; a light source driving unit configured to supply a first common voltage to an anode or a cathode of the light-emitting element to drive the light-emitting element; and a light signal processing unit configured to perform current/voltage conversion on an output current outputted from the light-receiving element, by referring to a second common voltage.

DETAILED DESCRIPTION

An object of one or more embodiments is to provide a light-emitting/receiving device and light-detecting method that improves accuracy in light detection.

First Embodiment

Figure 1:
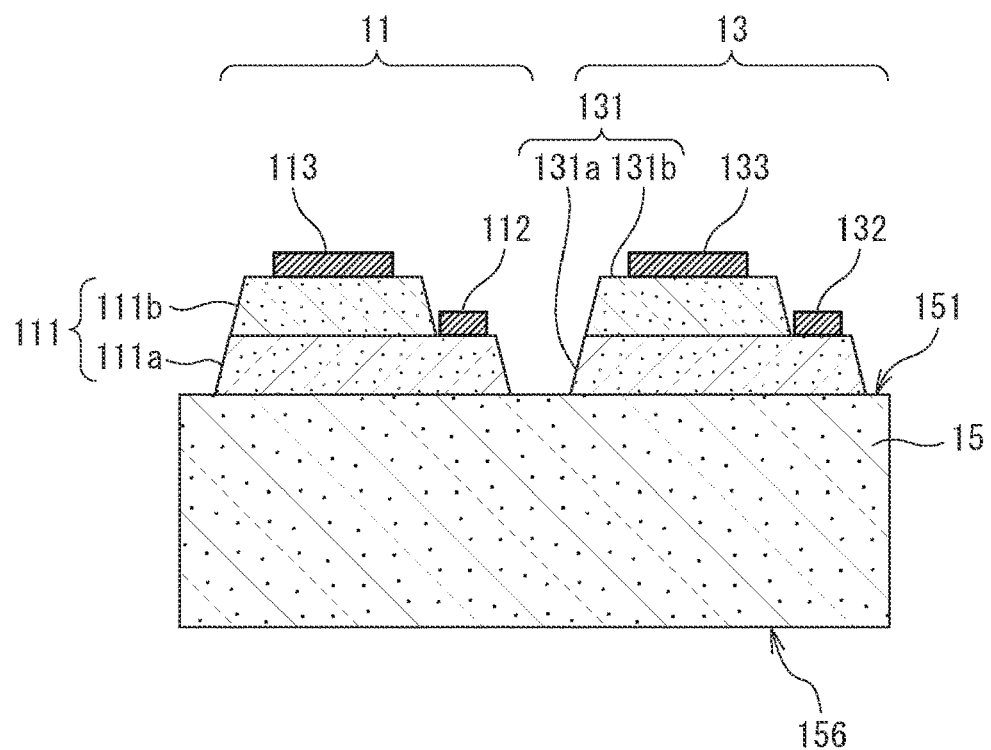
FIG. 1 is a cross-sectional view schematically illustrating configurations of a light-emitting element 11 and a light-receiving element 13 included in a light-emitting/receiving device 1 according to a first embodiment.

A light-emitting/receiving device and a light-detecting method according to a first embodiment will be described with reference to FIGS. 1 to 6. First, a configuration of a light-emitting/receiving device 1 according to the present embodiment will be schematically described with reference to FIGS. 1 to 3. As illustrated in FIG. 1, the light-emitting/receiving device 1 includes a semiconductor substrate 15, a light-emitting element 11 provided on a front face 151 of the semiconductor substrate 15, and a light-receiving element 13 provided on the front face 151 and adjacently to the light-emitting element 11. The semiconductor substrate 15 is formed by using materials such as, for example, Si, GaAs, sapphire, InP, InAs, or Ge.

The light-emitting element 11 includes a semiconductor layer 111a of a first conductivity type formed on the front face 151 of the semiconductor substrate 15 and a semiconductor layer 111b of a second conductivity type formed on the semiconductor layer 111a. The semiconductor layer 111a of the first conductivity type is an n-type semiconductor layer and the semiconductor layer 111b of the second conductivity type is a p-type semiconductor layer. The semiconductor layer 111a and the semiconductor layer 111b are joined to form a p-n junction, thereby constituting a diode-type light-emitting member ill. The light-emitting element 11 includes a cathode electrode 112 formed on a portion of the semiconductor layer 111a where the semiconductor layer 111b is not formed and an anode electrode 113 formed on a portion of the semiconductor layer 111b. The light-emitting element 11 is thus a diode-type element. The light-emitting element 11 emits light to the semiconductor substrate 15 when a voltage is applied to the light-emitting member 111 in the forward direction. A part of the light emitted by the light-emitting element 11 is reflected on the back face 156 opposite to the front face 151 of the semiconductor substrate 15 and the rest of the light is transmitted through the back face 156 and emitted to the outside of the semiconductor substrate 15. A configuration has been described here in which light is emitted from the back face side of the light-emitting element 11 (semiconductor substrate 15) but light may be emitted in other directions. The light-emitting element 11 may be configured in such a manner as to emit light from the front face side of the light-emitting element 11 (the top face of the semiconductor layer 111*b* of the second conductivity type) or to emit light from the lateral face side of the light-emitting element 11 (the lateral faces of the semiconductor layer 111*a* of the first conductivity type and the semiconductor layer 111*b* of the second conductivity type).

The light-emitting element 11 may be formed by using a film deposition method such as molecular beam epitaxy (MBE) or chemical vapor deposition (CVD). The light-emitting element 11 functions as a light-emitting diode (LED) by receiving a supply of electric power to the light-emitting member 111 and emits light in a wave length depending on the band gap of the material forming the light-emitting member 111. The light-emitting element 11 can emit light in the infrared range (i.e., infrared rays) when the light-emitting member 111 (so-called the active layer) contains In or Sb. More specifically, light having a wave length of from 1 μm to 12 μm is outputted by using InSb, InAlSb, or InAsSb in the active layer.

The light-receiving element 13 includes a semiconductor layer 131*a* of the first conductivity type formed on the front face 151 of the semiconductor substrate 15 and a semiconductor layer 131*b* of the second conductivity type formed on the semiconductor layer 131*a*. The semiconductor layer 131*a* of the first conductivity type is an n-type semiconductor layer and the semiconductor layer 131*b* of the second conductivity type is a p-type semiconductor layer. The semiconductor layer 131*a* and the semiconductor layer 131*b* are joined to form a p-n junction, thereby constituting a diode-type light-receiving member 131. The light-receiving element 13 includes a cathode electrode 132 formed on a portion of the semiconductor layer 131*a* where the semiconductor layer 131*b* is not formed and an anode electrode 133 formed on a portion of the semiconductor layer 131*b*. The light-receiving element 13 is thus a diode-type element.

When a voltage is applied to the light-receiving member 131 in the reverse direction (reverse biased condition) and the light-receiving member 131 receives light emitted by the light-emitting element 11 or light coming from a light source or a heat source outside the light-emitting/receiving device 1, the light-receiving element 13 outputs an output current between the cathode electrode 132 and the anode electrode 133 in an intensity depending on the intensity of the received light. Note that the light-receiving element 13 may output an output current between the cathode electrode 132 and the anode electrode 133 in an intensity depending on the intensity of the received light when the light-receiving member 131 receives light with no voltage being applied (unbiased condition).

When the light-receiving element 13 is a diode-type element having a PIN junction including an intrinsic semiconductor layer, as will be described later, the light-receiving element 13 may output an output current between the cathode electrode 132 and the anode electrode 133 in an intensity depending on the intensity of the received light when the light-receiving member 131 receives light with no voltage being applied (unbiased condition).

The light-receiving member 131 of the light-receiving element 13 may include one of indium or antimony taking into account the response speed in signal processing. Further, the diode structure may include a mixed crystal material containing one of indium and antimony and further contain at least one material selected from the group consisting of Ga, Al, and As.

The semiconductor layers 111*a*, 131*a* of the first conductivity type are formed, for example, of an identical material and have an identical thickness. The semiconductor layers 111*b*, 131*b* are formed, for example, of an identical material and have an identical thickness.

The light-emitting member 111 may have an intrinsic semiconductor layer (so-called i-type semiconductor layer) between the semiconductor layer 111*a* and the semiconductor layer 111*b* to form a PIN junction. A barrier layer of the first conductivity type may be formed between the semiconductor layer 111*a* and the intrinsic semiconductor layer, and a barrier layer of the second conductivity type may be formed between the intrinsic semiconductor layer and the semiconductor layer 111*b*.

Similarly, the light-receiving member 131 may have an intrinsic semiconductor layer (so-called i-type semiconductor layer) between the semiconductor layer 131*a* and the semiconductor layer 131*b* to form a PIN junction. A barrier layer of the first conductivity type may be formed between the semiconductor layer 131*a* and the intrinsic semiconductor layer, and a barrier layer of the second conductivity type may be formed between the intrinsic semiconductor layer and the semiconductor layer 131*b*.

Note that, for the barrier layers, a material having an energy band gap greater than the energy band gap of the semiconductor layer 111*a* or the semiconductor layer 131*a* and greater than the energy band gap of the intrinsic semiconductor layer is used.

Figure 2:
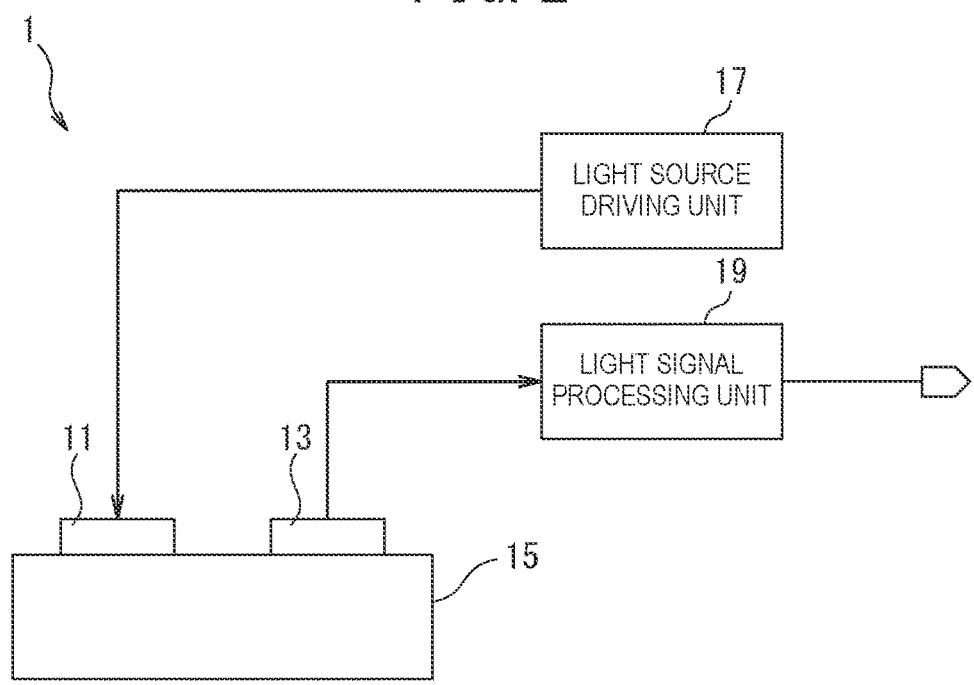
FIG. 2 is a block diagram schematically illustrating a configuration of the light-emitting/receiving device 1 according to the first embodiment.

As illustrated in FIG. 2, the light-emitting/receiving device 1 includes a diode-type light-emitting element 11 formed on the semiconductor substrate 15, a diode-type light-receiving element 13 formed on the same semiconductor substrate 15, a light source driving unit 17 configured to supply a voltage at a potential equal to the common voltage to the cathode electrode 112 (not illustrated in FIG. 2) of the light-emitting element 11 to drive the light-emitting element 11, and a light signal processing unit 19 configured to perform current/voltage conversion (to be sometimes referred to as "IV conversion" hereinafter) on an output current outputted from the light-receiving element 13, by referring to the common voltage.

Figure 3:
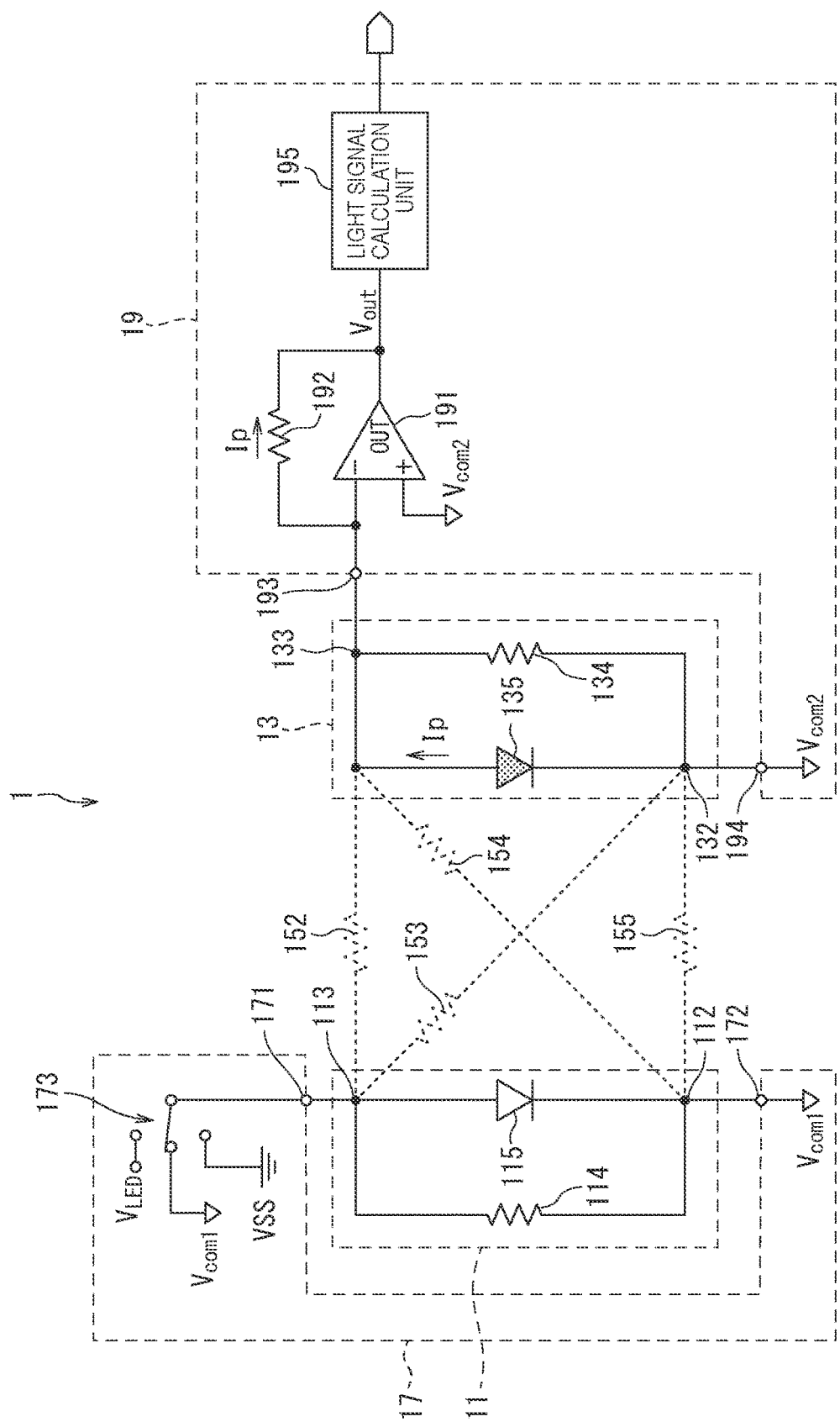
FIG. 3 is a block diagram schematically illustrating the configuration of the light-emitting/receiving device 1 according to the first embodiment and illustrating the light-emitting/receiving device 1 when the light-emitting element 11 is in the OFF state.

As illustrated in FIG. 3, the light source driving unit 17 includes a terminal 171 connected to the anode electrode 113 of the light-emitting element 11 and a terminal 172 connected to the cathode electrode 112 of the light-emitting element 11. The light source driving unit 17 includes a switch 173 connected to the terminal 171.

The switch 173 is provided for selecting a voltage to apply to the terminal 171 from among a low-potential-side source voltage VSS, a first common voltage Vcom1, and a drive voltage VLED. In other words, the switch 173 is provided for selecting a voltage to apply to the anode electrode 113 of the light-emitting element 11 from among the low-potential-side source voltage VSS, the first common voltage Vcom1, and the drive voltage VLED. The switching operation by the switch 173 is controlled by a control unit (not illustrated) provided in the light source driving unit 17. The voltage value of the first common voltage Vcom1 is not restricted to a particular value and, for example, may be set at a value between the drive voltage VLED and the low-potential-side source voltage VSS. For example, the first common voltage Vcom1 may be the analogue ground voltage and an intermediate voltage between the drive voltage VLED and the low-potential-side source voltage VSS.

The first common voltage Vcom1 is applied to the terminal 172. In other words, the first common voltage Vcom1 is applied to the cathode electrode 112 of the light-emitting element 11.

The light signal processing unit 19 includes an amplifier 191 configured to perform IV conversion on the output current Ip inputted thereto from the light-receiving element 13, a feedback resistor (an example of a feedback member) 192, and a light signal calculation unit 195 configured to calculate a light signal based on the output signal outputted from the amplifier 191.

The amplifier 191 includes a non-inverting input terminal (an example of a first input terminal) (+) to which a second common voltage Vcom2 is supplied, an inverting input terminal (an example of a second input terminal) (−) connected to the anode electrode (an example of an end) 133 of the light-receiving element 13, and an output terminal OUT from which an output voltage produced by IV conversion is outputted. The feedback resistor 192 is connected between the inverting input terminal (−) and the output terminal OUT. The second common voltage Vcom2 is an intermediate voltage between the high-potential-side source voltage VDD and the low-potential-side source voltage VSS of the light signal processing unit 19 and, for example, may be the analogue ground potential and may be an intermediate potential between the high-potential-side source voltage VDD and the low-potential-side source voltage VSS. Further, the second common voltage Vcom2 is a voltage lower than the drive voltage VLED to be applied to the anode electrode of the light-emitting element 11.

The light signal processing unit 19 includes a terminal 193 connected to the anode electrode 133 of the light-receiving element 13, to the inverting input terminal (−) of the amplifier 191, and to an end of the feedback resistor 192 and a terminal 194 connected to the cathode electrode 132 of the light-receiving element 13. The second common voltage Vcom2 is applied to the terminal 194. In other words, the second common voltage Vcom2 is applied to the cathode electrode 132 of the light-receiving element 13. Thus, the light signal processing unit 19 sets the cathode electrode (an example of the other end) 132 of the light-receiving element 13 at the second common voltage Vcom2.

In FIG. 3, the light-emitting element 11 is represented by an equivalent circuit. The light-emitting member 111 is represented by an equivalent circuit having an internal diode of the element 115 and an internal resistance of the element 114 connected in parallel between the anode electrode 113 and the cathode electrode 112. In FIG. 3, the light-receiving element 13 is represented by an equivalent circuit. The light-receiving element 13 is represented by an equivalent circuit having an internal diode of the element 135 and an internal resistance of the element 134 connected in parallel between the anode electrode 133 and the cathode electrode 132.

Parasitic resistances 152, 153, 154, 155 are formed between the light-emitting element 11 and the light-receiving element 13 through the semiconductor substrate 15 (see FIG. 1). The parasitic resistance 152 is formed between the anode electrode 113 and the anode electrode 133. The parasitic resistance 153 is formed between the anode electrode 113 and the cathode electrode 132. The parasitic resistance 154 is formed between the cathode electrode 112 and the anode electrode 133. The parasitic resistance 155 is formed between the cathode electrode 112 and the cathode electrode 132. As will be described later in detail, the parasitic resistances 152, 153, 154, 155 provide paths for leak currents, which deteriorate the accuracy in the light detection by the light-emitting/receiving device 1. It is difficult to form the light-emitting element 11 and the light-receiving element 13 without allowing the parasitic resistances 152, 153, 154, 155 to be formed. In view of this, the light-emitting/receiving device 1 according to the present embodiment is configured to reduce the effect of leak current and improve the accuracy in light detection by driving the light-emitting element 11 in a plurality of steps or phases.

Next, a light-detecting method according to the present embodiment will be described with reference to FIGS. 3 to 5. First, the light-detecting method with the light-emitting element 11 placed in the OFF state will be described with reference to FIG. 3. According to the light-detecting method of the light-emitting/receiving device 1, light detection is processed in three steps. The light-detecting method of the light-emitting/receiving device 1 with the light-emitting element 11 placed in the OFF state includes a step of setting the anode electrode 113 and the cathode electrode 112 of the diode-type light-emitting element 11 formed on the semiconductor substrate 15 at the first common voltage Vcom1, a step of setting the cathode electrode 132 of the light-receiving element 13 at the second common voltage Vcom2, and a step of performing IV conversion on the output current Ip from the diode-type light-receiving element 13 formed on the semiconductor substrate 15 by referring to the second common voltage Vcom2. The light-emitting/receiving device 1 places the light-emitting element 11 in the OFF state and performs detection by the light-receiving element 13. Herein the "OFF state" of the light-emitting element 11 means a state in which a voltage lower than the threshold voltage Vth of the light-emitting element 11 is applied in the forward direction of the light-emitting element 11. The threshold voltage Vth of the light-emitting element 11 is set as the forward voltage to cause a current of 1 mA to flow between the anode electrode 113 and the cathode electrode 112 of the light-emitting element 11. Further, the voltages of the anode electrode 113 and the cathode electrode 112 of the light-emitting element 11 need to be set at the first common voltage Vcom1 at the timing when IV conversion is performed on the output current Ip of the light-receiving element 13, and the voltages of the anode electrode 113 and the cathode electrode 112 of the light-emitting element 11 need not be set at the first common voltage Vcom1 at the timing when IV conversion is not performed on the output current Ip of the light-receiving element 13.

As illustrated in FIG. 3, the light-emitting/receiving device 1 operates the switch 173 in such a manner that the first common voltage Vcom1 is applied to the terminal 171 when the light-emitting element 11 is to be placed in the OFF state. In other words, the light source driving unit 17 sets the anode electrode 113 and the cathode electrode 112 of the light-emitting element 11 at the voltage with an equal potential to the first common voltage Vcom1 when the light-emitting element 11 is not to be driven. The voltage applied to the anode electrode 113 herein need not be exactly equal to the first common voltage Vcom1 applied to the cathode electrode 112. The voltage applied to the anode electrode 113 needs to be equal to the first common voltage Vcom1 to the extent that the light-emitting element 11 is in the OFF state and that leak current flowing through the leak paths does not affect the output current occurred in receiving the light of the light-receiving element 13.

The first common voltage Vcom1 is applied to both of the anode electrode 113 and the cathode electrode 112 of the light-emitting element 11. Thus, no forward voltage is applied to the light-emitting member 111 and no current flows through the light-emitting element 11.

The second common voltage Vcom2 is applied to the cathode electrode 132 of the light-receiving element 13. Since the inverting input terminal (−) of the amplifier 191 is at the second common voltage Vcom2 due to virtual short, the voltage applied to the anode electrode 133 of the light-receiving element 13 is the second common voltage Vcom2.

As a result, the potential difference between the anode electrode 113 and the cathode electrode 112 of the light-emitting element 11 and the anode electrode 133 and the cathode electrode 132 of the light-receiving element 13 is controlled by appropriately selecting the values of the first common voltage Vcom1 and the second common voltage Vcom2. Thus, leak current flowing from the light-emitting element 11 through the parasitic resistances 152, 153, 154, 155 to the light-receiving element 13 is reduced.

The first common voltage Vcom1 and the second common voltage Vcom2 may be selected in such a manner as to satisfy the relation (1)

$$|Vcom1-Vcom2| \leq 1 \ [V] \qquad (1)$$

Generally, since the resistance between a light-emitting element and a light-receiving element formed on the same substrate normally ranges from a few MΩ to dozens of MΩ or over, the leak current is reduced to the range of from hundreds of nA to dozens of nA or less when the potential difference between the first common voltage Vcom1 and the second common voltage Vcom2 is not more than 1 V. The potential difference between the first common voltage Vcom1 and the second common voltage Vcom2 may be not more than 0.5 V and may be not more than 0.1 V.

Further, the first common voltage Vcom1 and the second common voltage Vcom2 have approximately equal voltage values. In the relation (1), "|Vcom1−Vcom2|" may take any value from 0 to 1.

When the light-emitting element 11 is placed in the OFF state and the light-receiving element 13 receives light coming not from the light-emitting element 11 but from an external source, the effect of leak current due to parasitic resistances 152 to 155 of the semiconductor substrate 15 is reduced and the output current Ip depending on the amount of light coming from the outside is accurately detected. As a result, the output voltage Vout outputted by the amplifier 191 after IV conversion is a signal produced by voltage conversion on the output current Ip less affected by the leak current and hence the light signal processing unit 19 produces a light signal with improved accuracy.

Although not illustrated in FIG. 3, a control unit may be provided that is configured to control the switch 173 in accordance with a command signal to halt the light emitting side while receiving light.

Although a feedback resistor 192 is used for constituting the current-voltage conversion circuit in FIG. 3, a feedback capacitor may be used instead of a feedback resistor to constitute an integration-type current-voltage conversion circuit and a combination of resistance, capacitor, and inductance may be used to constitute a current-voltage conversion circuit with appropriate filtering characteristics.

Next, the light-detecting method of the light-emitting/receiving device 1 with the light-emitting element 11 placed in the ON state will be described with reference to FIGS. 4 and 5. The light-emitting/receiving device 1 calculates a light signal in two separate phases, i.e., a first phase and a second phase. Herein the "ON state" of the light-emitting element 11 means a state in which a voltage greater than the threshold voltage Vth of the light-emitting element 11 is applied in the forward direction of the light-emitting element 11.

Figure 4:
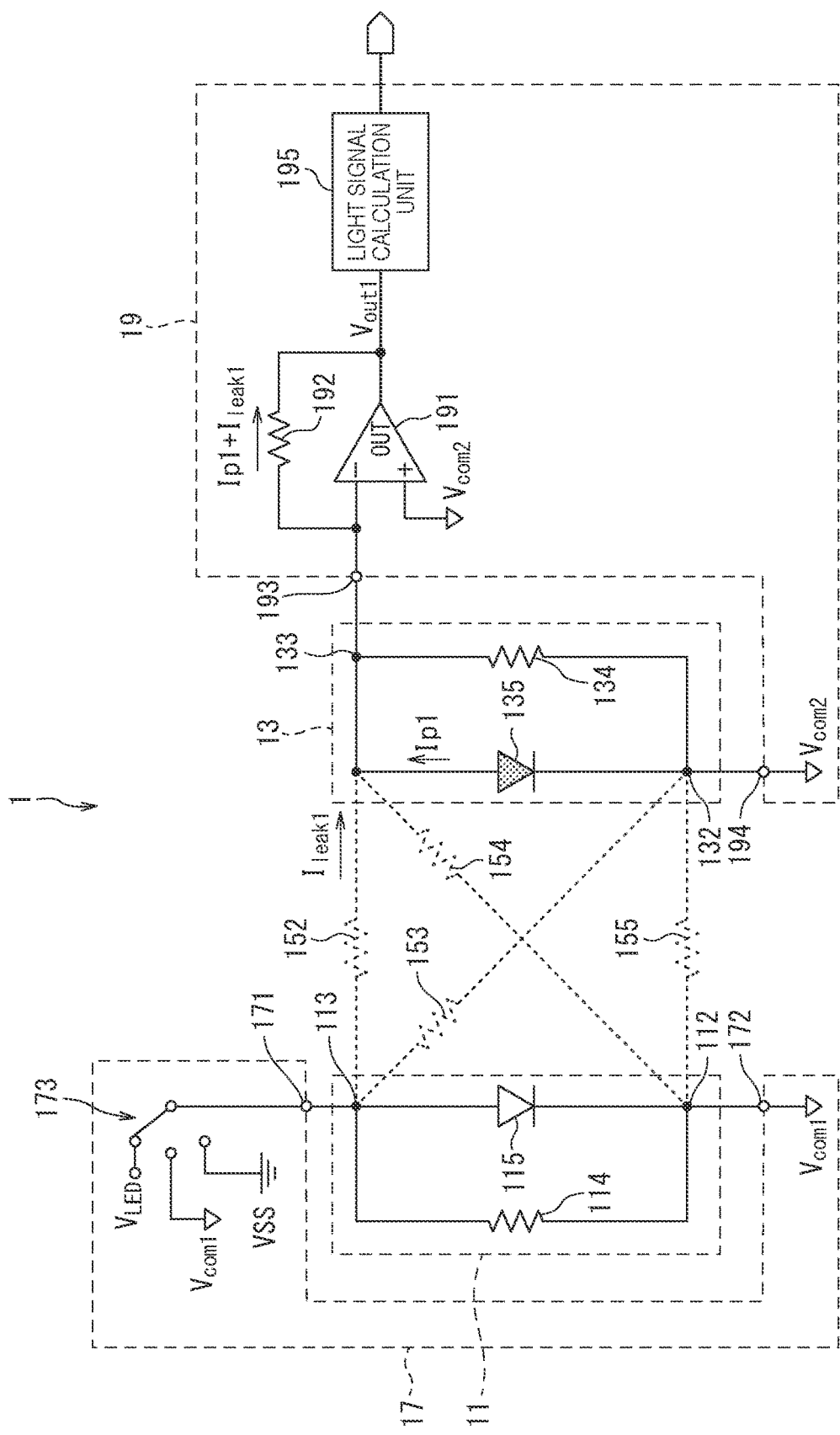
FIG. 4 is a block diagram schematically illustrating the configuration of the light-emitting/receiving device 1 according to the first embodiment and illustrating the light-emitting/receiving device 1 in a first phase of light detection.

In the first phase, as illustrated in FIG. 4, the light source driving unit 17 of the light-emitting/receiving device 1 supplies a drive voltage (an example of a first voltage) VLED having a greater voltage value than the first common voltage Vcom1 to the anode electrode 113 of the light-emitting element 11. In other words, the light source driving unit 17 operates the switch 173 in such a manner that the drive voltage VLED is applied to the terminal 171. The drive voltage VLED is thus supplied to the anode electrode 113 of the light-emitting element 11 through the terminal 171. The first common voltage Vcom1 having a smaller voltage value than the drive voltage VLED is applied to the cathode electrode 112 of the light-emitting element 11. The values of the drive voltage VLED and the first common voltage Vcom1 are selected in such a manner as to satisfy the relation "VLED−Vcom1≥Vth". As a result, a forward voltage not lower than the threshold voltage Vth of the light-emitting element 11 is applied to the light-emitting member 111 of the light-emitting element 11 and the light-emitting element 11 emits light from the light-emitting member 111. Light emitted from the light-emitting element 11 may be reflected on the back face of the semiconductor substrate 15 (see FIG. 1) and received by the light-receiving member 131 of the light-receiving element 13. Light emitted from the top face and the lateral faces of the light-emitting element 11 may be received by the light-receiving member 131.

Upon receiving light emitted from the light-emitting element 11, the light-receiving element 13 outputs an output current Ip1 from the anode electrode 133. The output current Ip1 flows through the terminal 193 and through the feedback resistor 192 of the light signal processing unit 19. The drive voltage VLED having a greater voltage value than the second common voltage Vcom2 is supplied to the anode electrode 113 of the light-emitting element 11. Therefore, a leak current Ileak1 flows from the light-emitting element 11 through the parasitic resistance 152 to the light-receiving element 13. The leak current Ileak1 flows through the terminal 193 and through the feedback resistor 192 of the light signal processing unit 19. Accordingly, the amplifier 191 outputs an output voltage Vout1 to the light signal calculation unit 195, the output voltage Vout1 being a voltage converted from the combined current of the output current Ip1 and the leak current Ileak1. Note that, other than this, leak current flowing from the terminal 171 through the parasitic resistance 153 to the terminal 194 and the like are not illustrated.

Figure 5:
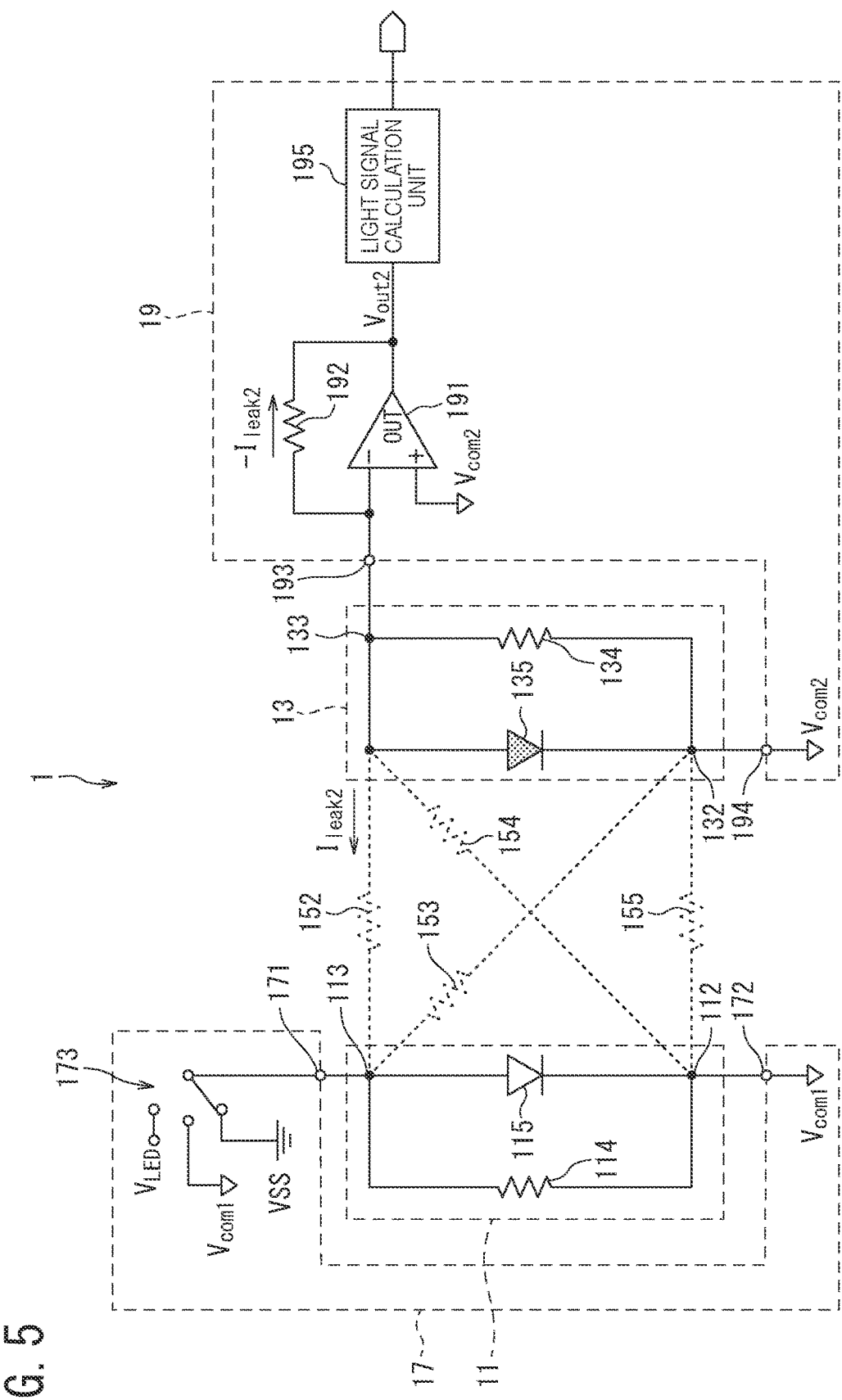
FIG. 5 is a block diagram schematically illustrating the configuration of the light-emitting/receiving device 1 according to the first embodiment and illustrating the light-emitting/receiving device 1 in a second phase of light detection.

In the second phase, as illustrated in FIG. 5, the light source driving unit 17 of the light-emitting/receiving device 1 supplies a low-potential-side source voltage (an example of a second voltage) VSS having a smaller voltage value than the first common voltage Vcom1 to the anode electrode 113 of the light-emitting element 11. In other words, the light source driving unit 17 operates the switch 173 in such a manner that the low-potential-side source voltage VSS is applied to the terminal 171. The low-potential-side source voltage VSS is thus supplied to the anode electrode 113 of the light-emitting element 11 through the terminal 171. The first common voltage Vcom1 having a greater voltage value than the low-potential-side source voltage VSS is applied to the cathode electrode 112 of the light-emitting element 11. As a result, a reverse voltage is applied to the light-emitting member 111 of the light-emitting element 11 and the light-emitting element 11 emits no light from the light-emitting member 111. Therefore, the light-receiving member 131 of the light-receiving element 13 outputs no output current produced by light emitted from the light-emitting element 11. Note that, although the first common voltage Vcom1 has been described herein as having a voltage value greater than the low-potential-side source voltage VSS, the first common voltage Vcom1 may be set at a smaller value than the low-potential-side source voltage VSS as long as the value is not smaller than the low-potential-side source voltage VSS minus the threshold voltage of the light-emitting element 11. In this case also, it is ensured that the light-emitting member 111 of the light-emitting element 11 emits no light by keeping the difference between the voltage value of the first common voltage Vcom1 and the voltage value of the low-potential-side source voltage VSS smaller than the threshold voltage of the light-emitting element 11.

The low-potential-side source voltage VSS having a smaller voltage value than the second common voltage Vcom2 is supplied to the anode electrode 113 of the light-emitting element 11. Therefore, a leak current Ileak2 flows from the light-receiving element 13 through the parasitic resistance 152 to the light-emitting element 11. In this case, the leak current Ileak2 flows from the output terminal OUT of the amplifier 191 of the light signal processing unit 19 through the feedback resistor 192 to the terminal 193. When the direction from the inverting input terminal (−) to the output terminal OUT of the amplifier 191 is taken to be the positive direction for the feedback resistor 192, the leak current Ileak2 in the second phase is a negative current. Therefore, the amplifier 191 outputs an output voltage Vout2 to the light signal calculation unit 195, the output voltage Vout2 being a voltage converted from the negative leak current Ileak2.

The light signal processing unit 19 calculates a light signal based on the output voltage Vout1 in the first phase and the output voltage Vout2 in the second phase. More specifically, the light signal calculation unit 195 of the light signal processing unit 19 adds the output voltage Vout1 and the output voltage Vout2. The output voltage Vout1 and the output voltage Vout2 are produced by IV conversion performed on currents flowing in directions opposite to each other. Further, the output voltage Vout1 is produced by IV conversion performed on the combined current of the output current Ip1 and the leak current Ileak1. In contrast, the output voltage Vout2 is produced by IV conversion performed on the leak current Ileak2. Therefore, the added voltage, i.e., the voltage produced by adding the output voltage Vout1 and the output voltage Vout2 is equivalent to the voltage that would result from IV conversion performed on the current produced by subtracting the leak current Ileak2 from the sum of the output current Ip1 and the leak current Ileak1.

The light-emitting/receiving device 1 thus reduces the effect of the leak current Ileak1 mixing into the output current Ip1 when IV conversion is performed in the light signal processing unit 19, and thereby improves the accuracy in light detection. The reduction of the effect of the leak current by adding the output voltage Vout1 and the output voltage Vout2 has been described herein but other operations than addition may be performed.

Figure 6:
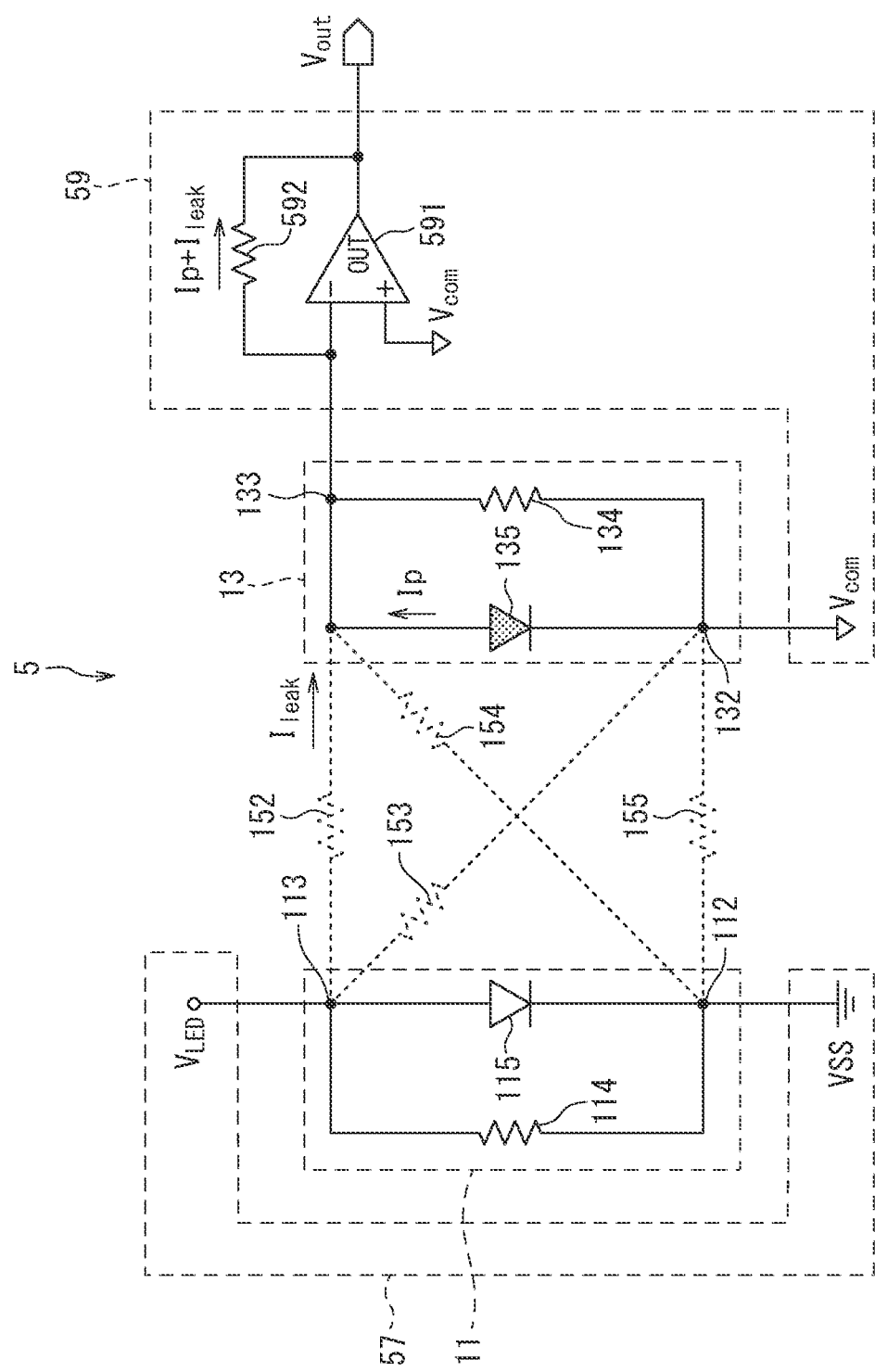
FIG. 6 is a block diagram for describing a light-emitting/receiving device 5 as a reference example.

In comparison, as illustrated in FIG. 6, a light-emitting/receiving device 5 as a reference example includes a light-emitting element 11 and a light-receiving element 13 configured similarly to those of the light-emitting/receiving device 1 according to the present embodiment. Parasitic resistances 152, 153, 154, 155 are formed between the light-emitting element 11 and the light-receiving element 13 through a semiconductor substrate (not illustrated). A light source driving unit 57 included in the light-emitting/receiving device 5 supplies a drive voltage VLED to the anode electrode 113 of the light-emitting element 11 and a low-potential-side source voltage VSS to the cathode electrode 112 of the light-emitting element 11 when driving the light-emitting element 11. Unlike the light source driving unit 17 according to the present embodiment, the light source driving unit 57 does not change the supplied voltages when driving the light-emitting element 11.

When the light-emitting/receiving device 5 drives the light-emitting element 11, a voltage greater than the anode electrode 133 of the light-receiving element 13 is supplied to the anode electrode 113 of the light-emitting element 11. Therefore, a leak current Ileak flows from the light-emitting element 11 side to the light-receiving element 13, for example, through the parasitic resistance 152. As a result, the light signal processing unit 59 included in the light-emitting/receiving device 5 outputs an output voltage Vout to the external circuit (not illustrated), the output voltage Vout being a voltage produced by IV conversion performed on the output current Ip outputted by the light-receiving element 13 and the leak current Ileak flowing from the light-emitting element 11 side in the amplifier 591 and the feedback resistor 592. Thus, the output voltage Vout outputted by the light-emitting/receiving device 5 is a voltage based on the output current Ip outputted by the light-receiving element 13 and the leak current Ileak. This deteriorates the accuracy in light detection by the light-emitting/receiving device 5.

With reference to FIGS. 4 and 5 again, in the light-emitting/receiving device 1 according to the present embodiment, if the current value of the leak current Ileak1 in the first phase and the current value of the leak current Ileak2 in the second phase are equal, the voltage corresponding to the leak current Ileak1 is offset by the voltage corresponding to the leak current Ileak2 when the light signal calculation unit 195 adds the output voltage Vout1 and the output voltage Vout2. This enables the light signal calculation unit 195 to output a result of the calculation with high accuracy based on the output current Ip with the leak current excluded.

It would be ideal if the current value of the leak current Ileak1 and the current value of the leak current Ileak2 were equal because the leak current Ileak1 would be fully offset by the leak current Ileak2. However, it is difficult in practice to have equal current values for the leak current Ileak1 and the leak current Ileak2. In addition, when the absolute value of the current value of the leak current Ileak2 is twice as great as the absolute value of the current value of the leak current Ileak1 or more, the voltage produced by adding the output voltage Vout1 to the output voltage Vout2 contains a voltage equivalent to the voltage that would be produced by IV conversion performed on a leak current Ileak2 having a current value equal to or more than the current value of the leak current Ileak1.

To address this, the light-emitting/receiving device 1 is configured to supply such voltages to the light-emitting element 11 as to satisfy the relation (2) below, wherein VLED1 is the drive voltage VLED, VLED2 is the low-potential-side source voltage VSS, and Vcom2 is the second common voltage.

$$2 \times (V\text{LED1} - V\text{com2}) > (V\text{com2} - V\text{LED2}) \qquad (2)$$

This makes the absolute value of the current value of the leak current Ileak2 smaller than twice the absolute value of the current value of the leak current Ileak1. As a result, the effect of the leak current Ileak1 on the added voltage calculated by the light signal calculation unit 195 is reduced by the leak current Ileak2.

In the light-emitting/receiving device 1 according to the present embodiment, the second voltage applied to the anode electrode 113 of the light-emitting element 11 in the second phase is the low-potential-side source voltage VSS but the second voltage is not restricted thereto. The second voltage may be a voltage satisfying the relation (3) below, wherein VLED2 is a second voltage applied to the anode electrode 113 in the second phase, VLED1 is a first voltage applied to the anode electrode 113 in the first phase, and Vcom2 is a second common voltage.

$$(VLED1-Vcom2)=(Vcom2-VLED2) \quad (3)$$

Further, the second voltage may satisfy the relation (4) below.

$$VLED1 > Vcom2 > VLED2 \quad (4)$$

In the present embodiment, when the relation (2) and the relation (3) or relation (4) are satisfied and the light-emitting element 11 is in the OFF state, a first common voltage Vcom1, for example, that satisfies the relation (1) with respect to the voltage supplied to the cathode electrode 132 of the light-receiving element 13 (the second common voltage Vcom2 in the present embodiment) is applied to both of the anode electrode 113 and the cathode electrode 112 of the light-emitting element 11. The light-emitting/receiving device 1 thereby reduces the effect of leak current in both cases when the light-emitting element 11 is in the OFF state and in the ON state. As a result, the light-emitting/receiving device 1 improves the accuracy in light detection compared with the light-emitting/receiving device 5 according to the reference example, which carries out no particular processing on leak current.

The light signal calculation unit 195 may perform analogue/digital conversion (to be referred to as "AD conversion" hereinafter) on the output voltage Vout1, store or retain the output voltage Vout1 in the form of a digital signal, and compare it with the output voltage Vout2, which is also AD-converted. The light signal calculation unit 195 may output the added voltage in the form of a digital signal to the external circuit (not illustrated) or may perform digital/analogue conversion on the added voltage and output the added voltage in the form of an analogue signal to the external circuit.

As described above, the light-emitting/receiving device and the light-detecting method according to the present embodiment curtail the deterioration of accuracy in light detection due to leak current. In other words, the light-emitting/receiving device and the light-detecting method according to the present embodiment improve the accuracy in light detection.

In particular, when the light-emitting element 11 is placed in the OFF state, the light-emitting/receiving device 1, instead of setting the anode electrode 113 of the light-emitting element 11 in a floating state or at the low-potential-side source voltage VSS, sets the anode electrode 113 and the cathode electrode 112 at a voltage (e.g., the first common voltage Vcom1 that satisfies the relation (1)) equal to the voltage at which the cathode electrode 132 of the light-receiving element 13 is set (the second common voltage Vcom2 in the present embodiment, which serves as the reference voltage when the light signal processing unit 19 performs IV conversion on the output current Ip inputted thereto from the light-receiving element 13). The light-emitting/receiving device 1 thus curtails the leak currents flowing from the light-emitting element 11 to the light-receiving element 13 and thereby improves the accuracy in light detection.

Although it is recited in the above description that a drive voltage (a first voltage VLED1) is supplied to the anode electrode 113 of the light-emitting element 11, controlling means for the light-emitting element 11 is not restricted to a voltage supply means.

The effects described above is achieved, for example, by controlling the driving of the light-emitting element 11 by a current supply means (a drive current source) while setting the voltage values of the anode electrode 113 of the light-emitting element 11 at the above-described voltages. The same applies to other embodiments.

The first common voltage value and the second common voltage value in the second phase may be different from the first common voltage value and the second common voltage value in the first phase. In such a case, there may be a phase in which the light-receiving element makes measurement while the light-emitting element is halted by using the first common voltage of the first phase and a phase in which the light-receiving element makes measurement while the light-emitting element is halted by using the first common voltage of the second phase. In such a case, similarly to the case where a single second common voltage Vcom2 is used as described above with reference to FIGS. 1 to 5, the second common voltage of the first phase and the second common voltage of the second phase may be selected in such a manner as to satisfy the relation (5) or (6) below, wherein Vcom21 is the second common voltage of the first phase and Vcom22 is the second common voltage of the second phase.

$$VLED1-Vcom21=Vcom22-VLED2 \quad (5)$$

$$2\times(VLED1-Vcom21)>(Vcom22-VLED2) \quad (6)$$

Further, the reference voltage for the AD conversion in the subsequent stage in the first phase may be different from that in the second phase.

Modified Example

Figure 7:
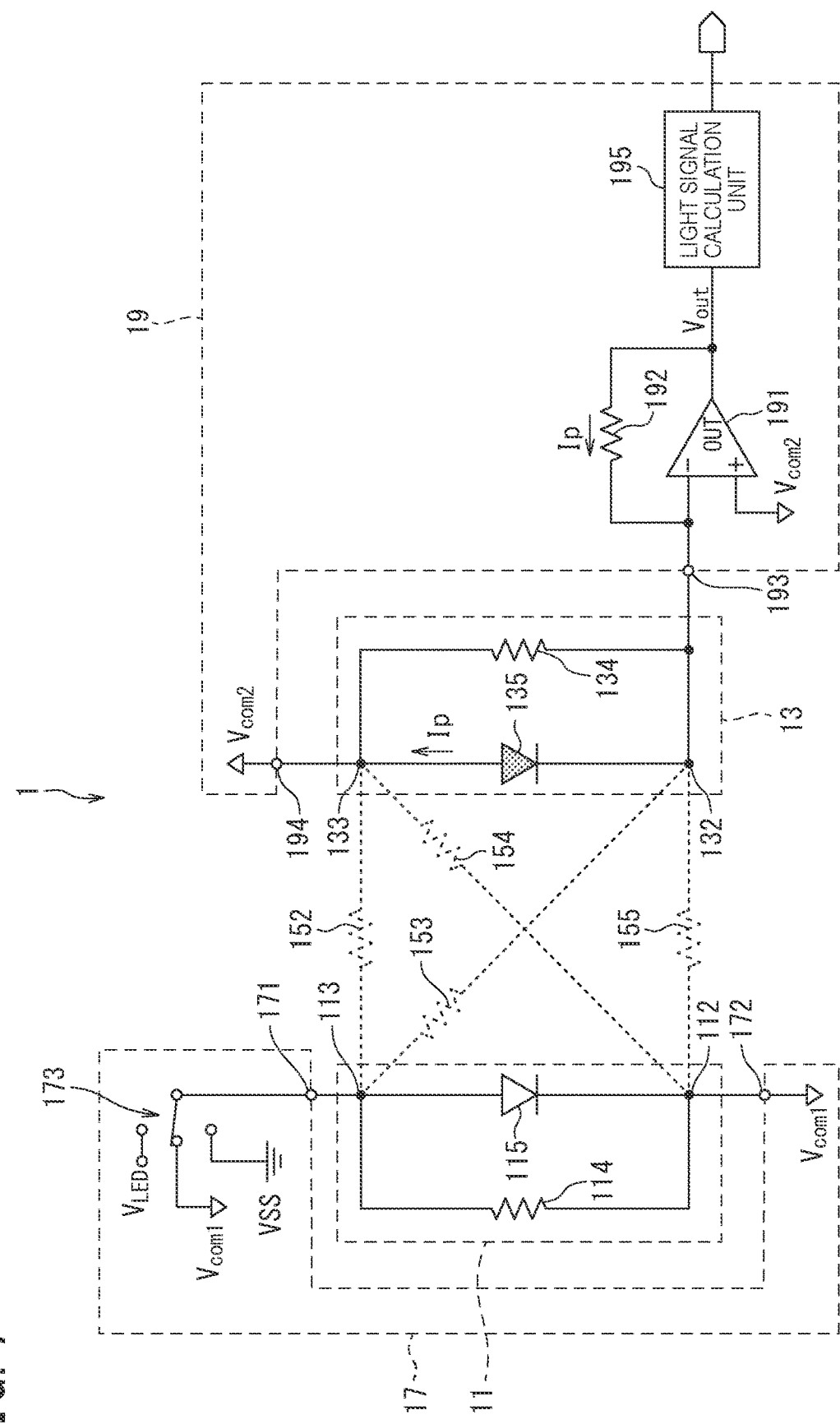
FIG. 7 is a block diagram schematically illustrating the configuration of the light-emitting/receiving device 1 according to a modified example of the first embodiment and illustrating the light-emitting/receiving device 1 when the light-emitting element 11 is in the OFF state.

Although in the above description the light signal processing unit 19 applies the second common voltage Vcom2 to the cathode electrode 132 of the light-receiving element 13 and performs IV conversion on the output current Ip outputted from the anode electrode 133 of the light-receiving element 13 by referring to the second common voltage Vcom2, the output current Ip of the light-receiving element 13 may be acquired by other arrangements than through the anode electrode 133 of the light-receiving element 13. For example, as illustrated in FIG. 7, the light-emitting/receiving device 1 according to a modified example of the present embodiment may apply the second common voltage Vcom2 to the anode electrode 133 of the light-receiving element 13 and perform IV conversion on the output current Ip outputted from the cathode electrode 132 of the light-receiving element 13 by referring to the second common voltage Vcom2. In other words, the output current Ip of the light-receiving element 13 may be acquired through the cathode electrode 132 of the light-receiving element 13. In this case, as illustrated in in FIG. 7, the output current Ip flows through the feedback resistor 192 in the opposite direction, compared with the case where the output current Ip is acquired through the anode electrode 133 of the light-receiving element 13.

Further, in light detection by the light-emitting/receiving device 1 with the light-emitting element 11 placed in the ON state, the leak current Ileak1 and the leak current Ileak2 flow through the parasitic resistance 152 when the output current Ip is acquired through the anode electrode 133 of the light-receiving element 13 and, in contrast, the leak current Ileak1 and the leak current Ileak2 flow through the parasitic resistance 153 when the output current Ip is acquired through the cathode electrode 132 of the light-receiving element 13. In the latter case also, the light-emitting/receiving device 1 and the light-detecting method according to the present modified example curtail the deterioration of accuracy in light detection due to leak current and improve the accuracy in light detection, similarly to the case where the output current Ip is acquired through the anode electrode 133 of the light-receiving element 13.

Second Embodiment

Figure 8:
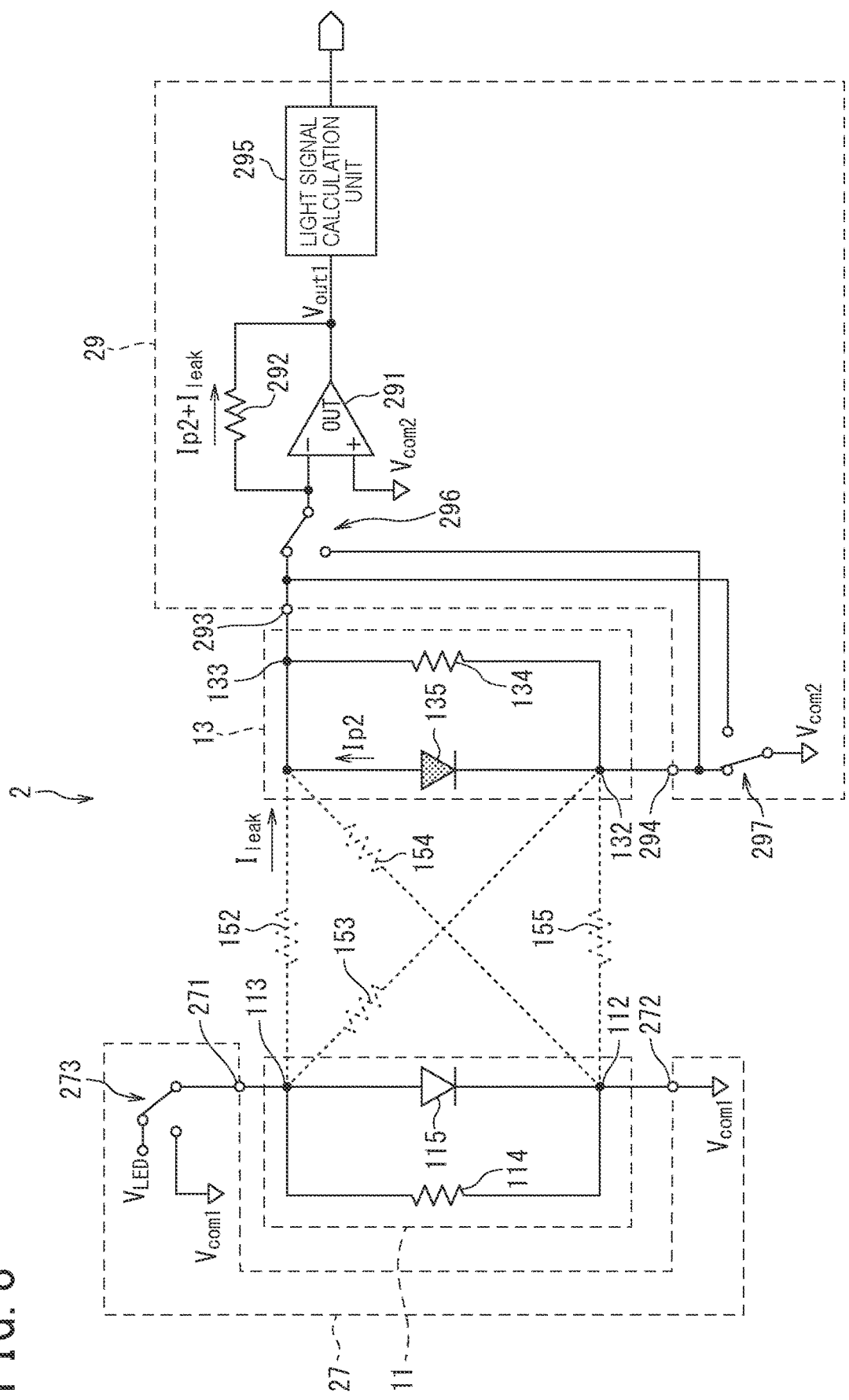
FIG. 8 is a block diagram schematically illustrating a configuration of a light-emitting/receiving device 2 according to a second embodiment and illustrating the light-emitting/receiving device 2 in a first phase of light detection.
Figure 9:
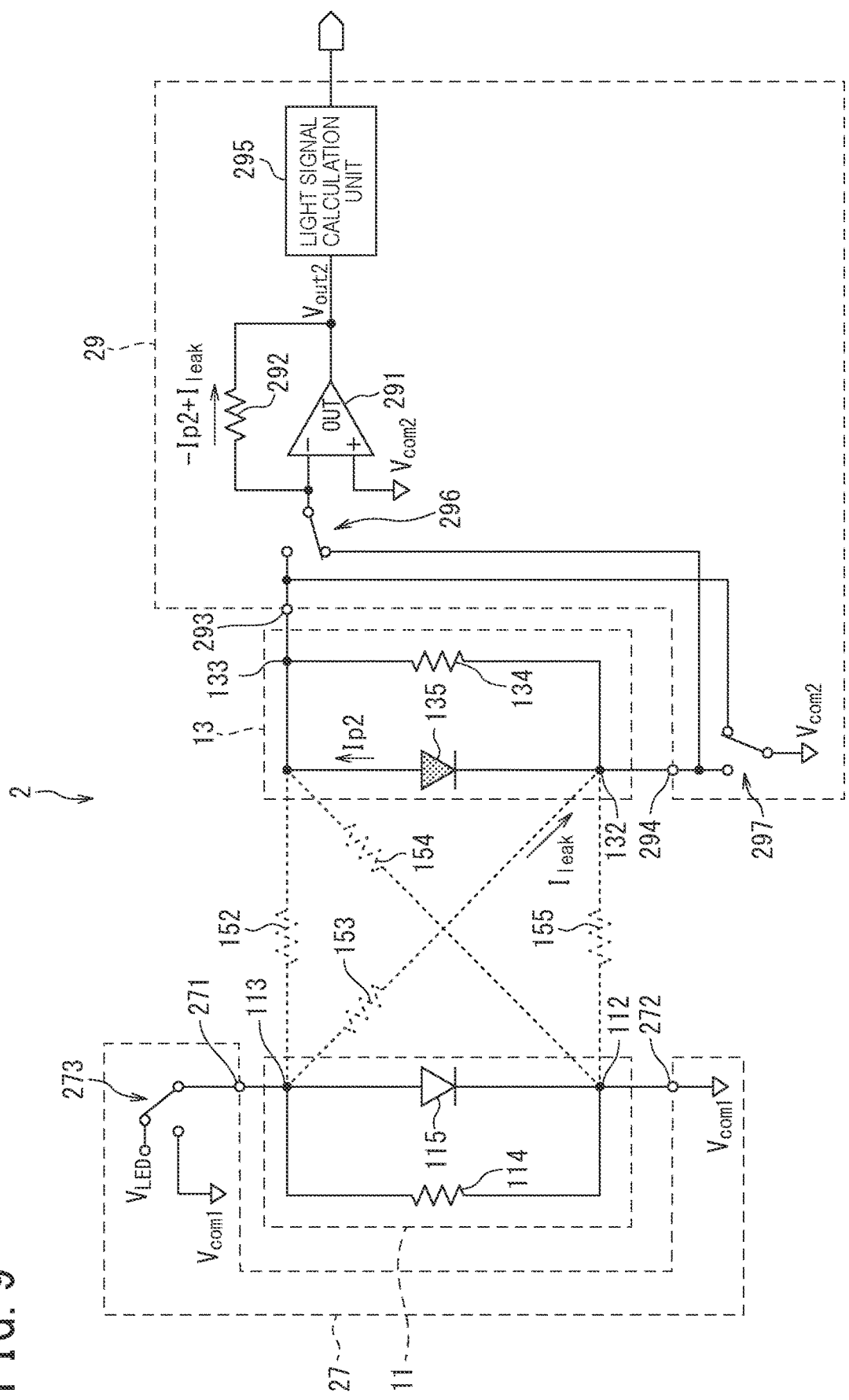
FIG. 9 is a block diagram schematically illustrating the configuration of the light-emitting/receiving device 2 according to the second embodiment and illustrating the light-emitting/receiving device 2 in a second phase of light detection.

A light-emitting/receiving device and a light-detecting method according to a second embodiment will be described with reference to FIGS. 8 and 9 and also referring to FIG. 1. The light-emitting/receiving device 2 according to the present embodiment includes a light-emitting element 11 and a light-receiving element 13 that have identical configuration and perform identical operations and functions to the light-emitting element 11 and the light-receiving element 13 included in the light-emitting/receiving device 1 according to the first embodiment. Hence the light-emitting element 11 and the light-receiving element 13 in the present embodiment will be denoted by the same reference signs and will not be further described. As illustrated in FIGS. 8 and 9, parasitic resistances 152, 153, 154, 155 are formed between the light-emitting element 11 and the light-receiving element 13 through a semiconductor substrate (not illustrated) also in the light-emitting/receiving device 2.

As illustrated in FIG. 8, the light-emitting/receiving device 2 includes a diode-type light-emitting element 11 formed on the semiconductor substrate, a diode-type light-receiving element 13 formed on the semiconductor substrate, a light source driving unit 27 configured to supply a voltage at a potential equal to the common voltage to the cathode electrode 112 of the light-emitting element 11 to drive the light-emitting element 11, and a light signal processing unit 29 configured to perform IV conversion on the output current outputted from the light-receiving element 13 by referring to the common voltage.

The light source driving unit 27 includes a terminal 271 connected to the anode electrode 113 of the light-emitting element 11 and a terminal 272 connected to the cathode electrode 112 of the light-emitting element 11. The light source driving unit 27 includes a switch 273 connected to the terminal 271.

The switch 273 is provided for selecting a voltage to apply to the terminal 271 from between a first common voltage Vcom1 and a drive voltage VLED. In other words, the switch 273 is provided for selecting a voltage to apply to the anode electrode 113 of the light-emitting element 11 from either the first common voltage Vcom1 or the drive voltage VLED. The switching operation by the switch 273 is controlled by a control unit (not illustrated) provided in the light source driving unit 27.

The first common voltage Vcom1 is applied to the terminal 272. In other words, the first common voltage Vcom1 is applied to the cathode electrode 112 of the light-emitting element 11.

Similarly to the light-emitting/receiving device 1 according to the first embodiment, the light-emitting/receiving device 2 operates the switch 273 to select the first common voltage Vcom1 when the light-emitting element 11 is to be placed in the OFF state. Thus, the light-emitting/receiving device 2 applies the first common voltage Vcom1 to both of the anode electrode 113 and the cathode electrode 112 when the light-emitting element 11 is placed in the OFF state. The second common voltage Vcom2 is applied to the cathode electrode 132 of the light-receiving element 13. Therefore, by selecting a first common voltage Vcom1 and a second common voltage Vcom2 that satisfy the relation (1) above, the leak current flowing from the light-emitting element 11 to the light-receiving element 13 is reduced. The light-emitting/receiving device 2 thus produces the same effects as the light-emitting/receiving device 1 when the light-emitting element 11 is placed in the OFF state.

The light signal processing unit 29 includes an amplifier 291 configured to perform IV conversion on the output current Ip2 inputted thereto from the light-receiving element 13, a feedback resistor (an example of a feedback member) 292, and a light signal calculation unit 295 configured to calculate a light signal based on the output voltage outputted from the amplifier 291. Further, the light signal processing unit 29 includes a terminal 293 and a terminal 294 as well as a switch 296 and a switch 297, which are operated for switching the output polarities of the light-receiving element 13.

The amplifier 291 includes a non-inverting input terminal (an example of a first input terminal) (+) to which a second common voltage Vcom2 is supplied, an inverting input terminal (an example of a second input terminal) (−) connected to an end of the switch 296, and an output terminal OUT from which an output voltage produced by IV conversion is outputted. The feedback resistor 292 is connected between the inverting input terminal (−) and the output terminal OUT.

One of the contacts on the other end of the switch 296 is connected to the anode electrode 133 of the light-receiving element 13 via the terminal 293 and the other of the contacts on the other end of the switch 296 is connected to the cathode electrode 132 of the light-receiving element 13 via terminal 294. The switch 296 switches electrodes to be connected to the inverting input terminal (−) of the amplifier 291 either the anode electrode 133 or the cathode electrode 132.

The second common voltage Vcom2 is applied to one end of the switch 297. One of the contacts on the other end of the switch 297 is connected to the anode electrode 133 of the light-receiving element 13 and the other of the contacts on the other end of the switch 297 is connected to the cathode electrode 132 of the light-receiving element 13. The switch 297 switches electrodes to which the second common voltage Vcom2 supplied to the light-receiving element 13 is applied either the anode electrode 133 or the cathode electrode 132.

The switch 296 and the switch 297 are controlled by a control unit (not illustrated) provided in the light signal processing unit 29. The control unit operates the switch 297 in such a manner that the second common voltage Vcom2 is applied to the cathode electrode 132 when the switch 296 is operated in such a manner that the anode electrode 133 is connected to the inverting input terminal (−) of the amplifier 291. Further, the control unit operates the switch 297 in such a manner that the second common voltage Vcom2 is applied to the anode electrode 133 when the switch 296 is operated in such a manner that the cathode electrode 132 is connected to the inverting input terminal (−) of the amplifier 291.

Next, a light-detecting method of the light-emitting/receiving device 2 according to the present embodiment will be described with reference to FIGS. 8 and 9. The light-emitting/receiving device 2 detects a light signal in two phases, i.e., a first phase and a second phase.

In the first phase, as illustrated in FIG. 8, the light signal processing unit 29 of the light-emitting/receiving device 2 controls the switch 296 in such a manner that the anode electrode 133 of the light-receiving element 13 is connected to the inverting input terminal (−) of the amplifier 291 and controls the switch 297 in such a manner that the second common voltage Vcom2 is supplied to the cathode electrode 132 of the light-receiving element 13.

Further, in the first phase, the light source driving unit 27 operates the switch 273 in such a manner that the drive voltage VLED is applied to the terminal 271. Thus, in the first phase, the light source driving unit 27 of the light-emitting/receiving device 2 supplies the drive voltage VLED to the anode electrode 113 of the light-emitting element 11. The first common voltage Vcom1 having a smaller voltage value than that of the anode electrode 113 (drive voltage VLED) is applied to the cathode electrode 112 of the light-emitting element 11. As a result, a forward voltage is applied to the light-emitting member 111 of the light-emitting element 11 and the light-emitting element 11 emits light from the light-emitting member 111. Light emitted from the light-emitting element 11 may be reflected on the back face of the semiconductor substrate and received by the light-receiving member 131 of the light-receiving element 13.

Upon receiving light emitted from the light-emitting element 11, the light-receiving element 13 outputs an output current Ip2 from the anode electrode 133. The output current Ip2 flows through the terminal 293 and through the feedback resistor 292 of the light signal processing unit 29. Further, the drive voltage VLED is supplied to the anode electrode 113 of the light-emitting element 11. The first common voltage Vcom1 is applied to the cathode electrode 112 of the light-emitting element 11. Therefore, a leak current Ileak flows from the light-emitting element 11 through the parasitic resistance 152 to the light-receiving element 13. The leak current Ileak flows through the terminal 293 and through the feedback resistor 292 of the light signal processing unit 29. Accordingly, the amplifier 291 outputs an output voltage Vout1 to the light signal calculation unit 295, the output voltage Vout1 being a voltage converted from the combined current of the output current Ip2 and the leak current Ileak.

As illustrated in FIG. 9, in the second phase, the light signal processing unit 29 of the light-emitting/receiving device 2 controls the switch 296 in such a manner that the cathode electrode 132 of the light-receiving element 13 is connected to the inverting input terminal (−) of the amplifier 291 and controls the switch 297 in such a manner that the second common voltage Vcom2 is supplied to the anode electrode 133 of the light-receiving element 13.

Further, in the second phase, similarly to the first phase, the light source driving unit 27 of the light-emitting/receiving device 2 supplies the drive voltage VLED to the anode electrode 113 of the light-emitting element 11 and supplies the first common voltage Vcom1 to the cathode electrode 112 of the light-emitting element 11. As a result, a forward voltage is applied to the light-emitting member 111 of the light-emitting element 11 and the light-emitting element 11 emits light from the light-emitting member 111. Light emitted from the light-emitting element 11 is reflected on the back face of the semiconductor substrate and received by the light-receiving member 131 of the light-receiving element 13.

As described above, the switches 296, 297 are switched over from their respective states of connection in the first phase to the other states of connection in the second phase. Therefore, in the second phase, the light signal processing unit 29 performs IV conversion on the output current with inverse output polarity outputted from the light-receiving element 13 as compared with the first phase.

More specifically, upon receiving light emitted from the light-emitting element 11, the light-receiving element 13 outputs an output current Ip2, which flows from the cathode electrode 132 to the anode electrode 133. Therefore, the output current Ip2 flows through the feedback resistor 292 in the direction from the output terminal OUT of the amplifier 291 to the switch 296, which is opposite to the direction of the output current Ip2 in the first phase. Further, the drive voltage VLED having a greater voltage value than the first common voltage Vcom1 is supplied to the anode electrode 113 of the light-emitting element 11 and the voltage value at the anode electrode 113 is greater than the first common voltage Vcom1. Thus, leak current Ileak is inputted to the light signal processing unit 29 through the parasitic resistance 153 and the terminal 294. Therefore, the leak current Ileak flows through the feedback resistor 292 in the direction from the switch 296 to the output terminal OUT of the amplifier 291, which is the same direction of the leak current Ileak in the first phase.

When the direction from the inverting input terminal (−) to the output terminal OUT of the amplifier 291 is taken to be the positive direction for the feedback resistor 292, the amplifier 291 outputs an output voltage Vout2 to the light signal calculation unit 295, the output voltage Vout2 being a voltage converted from the combined current of the output current Ip2, which is negative, and the leak current Ileak, which is positive.

The light signal calculation unit 295 included in the light signal processing unit 29 calculates a light signal based on the output voltage Vout1 produced by the conversion in the first phase and the output voltage Vout2 produced by the conversion in the second phase. More specifically, the light signal calculation unit 295 subtracts the output voltage Vout2 from the output voltage Vout1 to calculate a subtracted voltage, outputs a signal having a voltage half the subtracted voltage to the external circuit. The leak current Ileak in the first phase is inputted to the light signal processing unit 29 through the parasitic resistance 152. The leak current Ileak in the second phase is inputted to the light signal processing unit 29 through the parasitic resistance 153. Accordingly, the leak currents Ileak flow in the same direction in both phases even if the current value of the leak current Ileak in the first phase is not equal to that of the leak current Ileak in the second phase. Therefore, the subtracted voltage, calculated by subtracting the output voltage Vout2 from the output voltage Vout1, is equivalent to the voltage that would be produced by IV conversion on a current with a reduced ratio of the current value of a leak current Ileak to the current value of the output current Ip2. The light-emitting/receiving device 2 thus curtails the deterioration of accuracy in light detection due to leak current.

The light signal calculation unit 295 may perform AD conversion on the output voltage Vout1, store the output voltage Vout1 in the form of a digital signal, and compare it with the output voltage Vout2, which is also AD-converted. The light signal calculation unit 295 may output the subtracted voltage in the form of a digital signal to the external circuit (not illustrated) or may perform digital/analogue conversion on the subtracted voltage and output the voltage in the form of an analogue signal to the external circuit.

As described above, the light-emitting/receiving device and the light-detecting method according to the present embodiment curtail the deterioration of accuracy in light detection due to leak current and thus produce the same effects as the light-emitting/receiving device and the light-detecting method according to the first embodiment.

Third Embodiment

Figure 10:
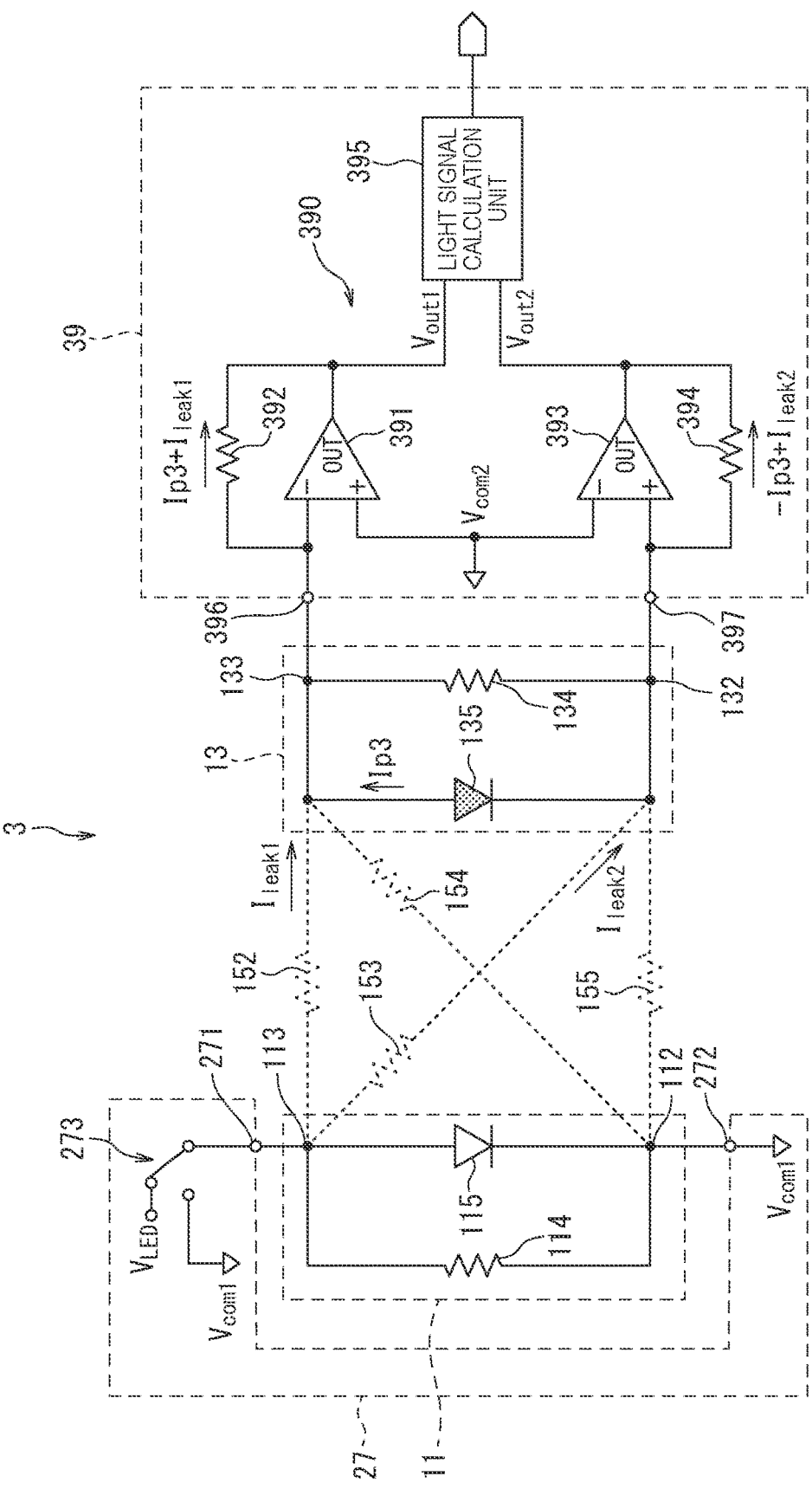
FIG. 10 is a block diagram schematically illustrating a configuration of a light-emitting/receiving device 3 according to a third embodiment.

A light-emitting/receiving device and a light-detecting method according to a third embodiment will be described with reference to FIG. 10. The light-emitting/receiving device 3 according to the present embodiment includes a light-emitting element 11 and a light-receiving element 13 that have identical configuration and perform identical operations and functions to the light-emitting element 11 and the light-receiving element 13 included in the light-emitting/receiving device 1 according to the first embodiment. Hence the light-emitting element 11 and the light-receiving element 13 in the present embodiment will be denoted by the same reference signs and will not be further described. As illustrated in FIG. 10, parasitic resistances 152, 153, 154, 155 are formed between the light-emitting element 11 and the light-receiving element 13 through a semiconductor substrate (not illustrated) also in the light-emitting/receiving device 3.

As illustrated in FIG. 10, the light-emitting/receiving device 3 includes a diode-type light-emitting element 11 formed on the semiconductor substrate, a diode-type light-receiving element 13 formed on the semiconductor substrate, a light source driving unit 27 configured to supply a first common voltage Vcom1 to the cathode electrode 112 of the light-emitting element 11 to drive the light-emitting element 11, and a light signal processing unit 39 configured to perform IV conversion on the output current outputted from the light-receiving element 13 by referring to a second common voltage Vcom2. The light source driving unit 27 in the present embodiment has an identical configuration and performs identical operations and functions to the light source driving unit 27 and hence will not be further described.

Similarly to the light-emitting/receiving device 1 according to the first embodiment, the light-emitting/receiving device 3 operates the switch 273 to select the first common voltage Vcom1 when the light-emitting element 11 is to be placed in the OFF state. Thus, the light-emitting/receiving device 3 applies the first common voltage Vcom1 to both of the anode electrode 113 and the cathode electrode 112 when the light-emitting element 11 is placed in the OFF state. The second common voltage Vcom2 is applied to the cathode electrode 132 of the light-receiving element 13. Therefore, by selecting a first common voltage Vcom1 and a second common voltage Vcom2 that satisfy the relation (1) above, the leak current flowing from the light-emitting element 11 to the light-receiving element 13 is reduced. The light-emitting/receiving device 3 can thereby produce the same effects as the light-emitting/receiving device 1 when the light-emitting element 11 is placed in the OFF state.

The light signal processing unit 39 includes a fully differential amplifier 390 configured to refer to the second common voltage Vcom2, a terminal 396, a terminal 397, and a light signal calculation unit 395 configured to calculate a light signal based on the output voltage outputted by the fully differential amplifier 390. The fully differential amplifier 390 includes differential inputs having a terminal 396 and a terminal 397 as input terminals and a feedback member for each differential input and is configured to output a differential signal by referring to the second common voltage Vcom2. More specifically, the fully differential amplifier 390 includes an amplifier 391 configured to perform IV conversion on the output current Ip3 inputted thereto from the light-receiving element 13 and a feedback resistor (an example of a feedback member) 392. The fully differential amplifier 390 also includes an amplifier 393 configured to perform IV conversion on the output current Ip3 outputted to the light-receiving element 13 and a feedback resistor (an example of a feedback member) 394.

The amplifier 391 includes a non-inverting input terminal (an example of a first input terminal) (+) to which the second common voltage Vcom2 is supplied, an inverting input terminal (an example of a second input terminal) (−) connected to the terminal 396, and an output terminal OUT from which an output voltage produced by IV conversion is outputted. The output terminal OUT of the amplifier 391 is connected to the light signal calculation unit 395. The feedback resistor 392 is connected between the inverting input terminal (−) and the output terminal OUT of the amplifier 391.

The amplifier 393 includes an inverting input terminal (an example of a first input terminal) (−) to which the second common voltage Vcom2 is supplied, a non-inverting input terminal (an example of a second input terminal) (+) connected to the terminal 397, and an output terminal OUT from which an output voltage produced by IV conversion is outputted. The output terminal OUT of the amplifier 393 is connected to the light signal calculation unit 395. The feedback resistor 394 is connected between the non-inverting input terminal (+) and the output terminal OUT of the amplifier 393.

Thus, in the fully differential amplifier 390, the inverting input terminal (−) of the amplifier 391 and the non-inverting input terminal (+) of the amplifier 393 serve as differential input terminals and the output terminals OUT of the amplifier 391 and the amplifier 393 serve as differential output terminals.

Next, the light-detecting method of the light-emitting/receiving device 3 according to the present embodiment will be described with reference to FIG. 10.

As illustrated in FIG. 10, the light source driving unit 27 of the light-emitting/receiving device 3 controls the switch 273 to supply the drive voltage VLED to the anode electrode 113 of the light-emitting element 11. The first common voltage Vcom1 is applied to the cathode electrode 112 of the light-emitting element 11. As a result, a forward voltage is applied to the light-emitting member 111 of the light-emitting element 11 and the light-emitting element 11 emits light from the light-emitting member 111. Light emitted from the light-emitting element 11 may be reflected on the back face of the semiconductor substrate and received by the light-receiving member 131 of the light-receiving element 13.

Upon receiving light emitted from the light-emitting element 11, the light-receiving element 13 outputs an output current Ip3, which flows from the cathode electrode 132 to the anode electrode 133. The output current Ip3 flows through the terminal 396 and through the feedback resistor 392 of the light signal processing unit 39.

The drive voltage VLED is supplied to the anode electrode 113 of the light-emitting element 11 and the first common voltage Vcom1 is applied to the cathode electrode 112 of the light-emitting element 11. Therefore, a leak current Ileak1 flows from the light-emitting element 11 through the parasitic resistance 152 to the light-receiving element 13. The leak current Ileak1 flows through the terminal 396 and through the feedback resistor 392 of the light signal processing unit 39.

Accordingly, the amplifier 391 outputs an output voltage Vout1 to the light signal calculation unit 395, the output voltage Vout1 being a voltage converted from the combined current of the output current Ip3 and the leak current Ileak1.

As the output current Ip3 flows from the cathode electrode 132 to the anode electrode 133, the output current Ip3 flows through the feedback resistor 394 from the output terminal OUT of the amplifier 393 to the terminal 397.

The drive voltage VLED is supplied to the anode electrode 113 of the light-emitting element 11 and the first common voltage Vcom1 is applied to the cathode electrode 112 of the light-emitting element 11. Therefore, a leak current Ileak2 is inputted to the light signal processing unit 39 through the parasitic resistance 153 and the terminal 397 and flows through the feedback resistor 394. Since the leak current Ileak2 flows through the feedback resistor 394 in the direction from the terminal 397 to the output terminal OUT of the amplifier 393, the direction of the leak current Ileak2 is opposite to the direction of the output current Ip3.

When the direction from the inverting input terminal (−) to the output terminal OUT of the amplifier 393 is taken to be the positive direction for the feedback resistor 394, the amplifier 393 outputs an output voltage Vout2 to the light signal calculation unit 395, the output voltage Vout2 being a voltage converted from the combined current of the output current Ip3, which is negative, and the leak current Ileak2, which is positive.

The light signal calculation unit 395 included in the light signal processing unit 39 calculates a light signal based on the output voltage Vout1 inputted from the amplifier 391 and the output voltage Vout2 inputted from the amplifier 393. More specifically, the light signal calculation unit 395 subtracts the output voltage Vout2 from the output voltage Vout1 and outputs the difference as a light signal. The leak current Ileak1 flows to the light signal processing unit 39 through the parasitic resistance 152. The leak current Ileak2 flows to the light signal processing unit 39 through the parasitic resistance 153. Accordingly, both leak currents Ileak flow in the same direction even if the current value of the leak current Ileak1 is not equal to that of the leak current Ileak2. Therefore, the subtracted voltage, calculated by subtracting the output voltage Vout2 from the output voltage Vout1, is equivalent to the voltage that would be produced by IV conversion on a current with a reduced ratio of the current value of a leak current Ileak to the current value of the output current Ip3. The light-emitting/receiving device 3 thus curtails the deterioration of accuracy in light detection due to leak current.

The fully differential amplifier 390 outputs the output voltage Vout1 and the output voltage Vout2 to the light signal calculation unit 395 almost at the same time.

As described above, the light-emitting/receiving device and the light-detecting method according to the present embodiment curtail the deterioration of accuracy in light detection due to leak current and thus produce the same effects as the light-emitting/receiving device and the light-detecting method according to the first embodiment.

Fourth Embodiment

Figure 11:
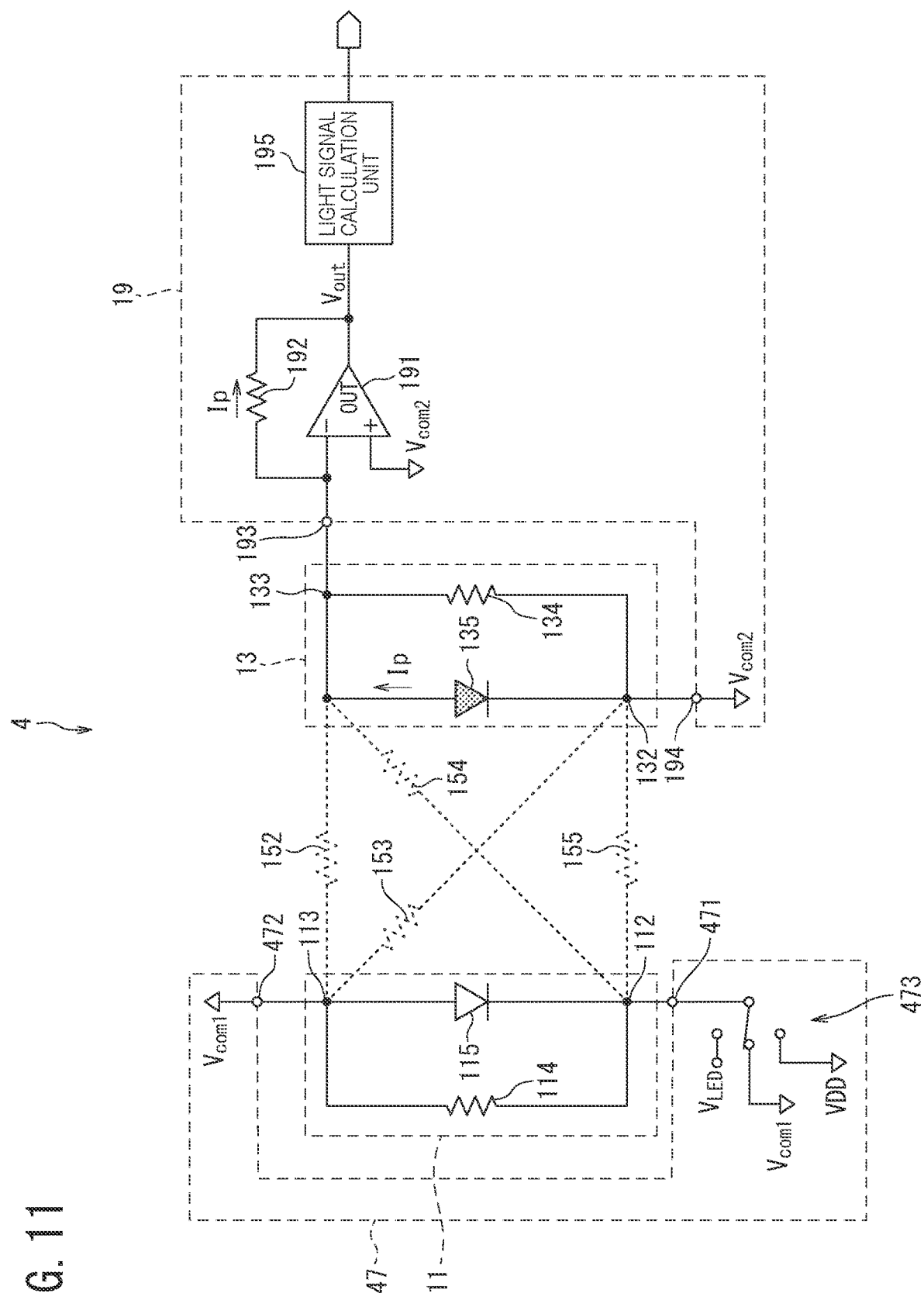
FIG. 11 is a block diagram schematically illustrating a configuration of the light-emitting/receiving device 4 according to a fourth embodiment and illustrating the light-emitting/receiving device 4 when the light-emitting element 11 is in the OFF state.

A light-emitting/receiving device and a light-detecting method according to a fourth embodiment will be described with reference to FIG. 11 and also referring to FIG. 1. The light-emitting/receiving device 4 according to the present embodiment includes a light-emitting element 11 and a light-receiving element 13 that have identical configuration and perform identical operations and functions to the light-emitting element 11 and the light-receiving element 13 included in the light-emitting/receiving device 1 according to the first embodiment. Hence the light-emitting element 11 and the light-receiving element 13 in the present embodiment will be denoted by the same reference signs and will not be further described. As illustrated in FIG. 11, parasitic resistances 152, 153, 154, 155 are formed between the light-emitting element 11 and the light-receiving element 13 through a semiconductor substrate (not illustrated) also in the light-emitting/receiving device 4.

Further, the light-emitting/receiving device 4 according to the present embodiment includes a light signal processing unit 19 configured to perform identical operations and functions to the light-emitting/receiving device 1 according to the first embodiment. Hence the light signal processing unit according to the present embodiment will be denoted by the same reference signs and will not be further described.

As illustrated in FIG. 11, the light-emitting/receiving device 4 includes a diode-type light-emitting element 11 formed on the semiconductor substrate, a diode-type light-receiving element 13 formed on the semiconductor substrate, a light source driving unit 47 configured to supply a voltage equal to a common voltage to the anode electrode 113 of the light-emitting element 11 to drive the light-emitting element 11, and a light signal processing unit 19 configured to perform IV conversion on the output current outputted from the light-receiving element 13 by referring to a common voltage.

The light source driving unit 47 includes a terminal 471 connected to the cathode electrode 112 of the light-emitting element 11 and a terminal 472 connected to the anode electrode 113 of the light-emitting element 11. The light source driving unit 47 includes a switch 473 connected to the terminal 471.

The switch 473 is provided for selecting a voltage to apply to the terminal 471 from either a high-potential-side source voltage VDD, a first common voltage Vcom1, or a drive voltage VLED. In other words, the switch 473 is provided for selecting a voltage to apply to the cathode electrode 112 of the light-emitting element 11 from either the high-potential-side source voltage VDD, the first common voltage Vcom1, or the drive voltage VLED. The switching operation by the switch 473 is controlled by a control unit (not illustrated) provided in the light source driving unit 47. The voltage value of the first common voltage Vcom1 is not restricted to a particular value and, for example, may be set at a value between the drive voltage VLED and the high-potential-side source voltage VDD. For example, the first common voltage Vcom1 may be the analogue ground voltage and an intermediate voltage between the drive voltage VLED and the high-potential-side source voltage VDD.

The first common voltage Vcom1 is applied to the terminal 472. In other words, the first common voltage Vcom1 is applied to the anode electrode 113 of the light-emitting element 11.

Similarly to the light-emitting/receiving device 1 according to the first embodiment, the light-emitting/receiving device 4 operates the switch 473 to select the first common voltage Vcom1 when the light-emitting element 11 is to be placed in the OFF state. Thus, the light-emitting/receiving device 4 applies the first common voltage Vcom1 to both of the anode electrode 113 and the cathode electrode 112 when the light-emitting element 11 is placed in the OFF state. The second common voltage Vcom2 is applied to the cathode electrode 132 of the light-receiving element 13. Therefore, by selecting a first common voltage Vcom1 and a second common voltage Vcom2 that satisfy the relation (1) above, the leak current flowing from the light-emitting element 11 to the light-receiving element 13 is reduced. The light-emitting/receiving device 4 thus produces the same effects as the light-emitting/receiving device 1 when the light-emitting element 11 is placed in the OFF state.

As described above, for the light-emitting/receiving device 4, similarly to the light-emitting/receiving device 1, the first common voltage Vcom1 and the second common voltage Vcom2 may be selected in such a manner as to satisfy the relation (1) above.

Further, for the light-emitting/receiving device 4, similarly to the light-emitting/receiving device 1, the potential difference between the first common voltage Vcom1 and the second common voltage Vcom2 may be not more than 0.5 V and may be not more than 0.1 V.

Further, for the light-emitting/receiving device 4, similarly to the light-emitting/receiving device 1, the first common voltage Vcom1 and the second common voltage Vcom2 may have approximately equal voltage values. In the relation (1), "|Vcom1−Vcom2|" may take any value from 0 to 1.

Although not illustrated in FIG. 11, a control unit may be provided that is configured to control the switch 473 in accordance with a command signal to halt the light emitting side while receiving light.

Next, the light-detecting method of the light-emitting/receiving device 4 with the light-emitting element 11 placed in the ON state will be described. Similarly to the light-emitting/receiving device 1, the light-emitting/receiving device 4 calculates a light signal in two separate phases, i.e., a first phase and a second phase.

In the first phase, the light source driving unit 47 of the light-emitting/receiving device 4 supplies a drive voltage (an example of a second voltage) VLED having a smaller voltage value than the first common voltage Vcom1 to the cathode electrode 112 of the light-emitting element 11. In other words, the light source driving unit 47 operates the switch 473 in such a manner that the drive voltage VLED is applied to the terminal 471. The drive voltage VLED is thus supplied to the cathode electrode 112 of the light-emitting element 11 through the terminal 471. The first common voltage Vcom1 having a greater voltage value than the drive voltage VLED is applied to the anode electrode 113 of the light-emitting element 11. The values of the drive voltage VLED and the first common voltage Vcom1 are selected in such a manner as to satisfy the relation "Vcom1−VLED ≥ Vth". As a result, similarly to the light-emitting/receiving device 1, a forward voltage not lower than the threshold voltage Vth of the light-emitting element 11 is applied to the light-emitting member 111 of the light-emitting element 11 and the light-emitting element 11 emits light from the light-emitting member 111. Light emitted from the light-emitting element 11 may be reflected on the back face of the semiconductor substrate 15 (see FIG. 1) and received by the light-receiving member 131 of the light-receiving element 13. Light emitted from the top face and the lateral faces of the light-emitting element 11 may be received by the light-receiving member 131.

Upon receiving light emitted from the light-emitting element 11, the light-receiving element 13 outputs an output current Ip1 from the anode electrode 133. The output current Ip1 flows through the terminal 193 and through the feedback resistor 192 of the light signal processing unit 19. The drive voltage VLED having a smaller voltage value than the second common voltage Vcom2 is supplied to the cathode electrode 112 of the light-emitting element 11. Therefore, a leak current Ileak1 flows from the light-receiving element 13 through the parasitic resistance 154 to the light-emitting element 11. The leak current Ileak1 flows through the terminal 193 and through the feedback resistor 192 of the light signal processing unit 19. In this case, the leak current Ileak1 flows from the output terminal OUT of the amplifier 191 of the light signal processing unit 19 through the feedback resistor 192 to the terminal 193. When the direction from the inverting input terminal (−) to the output terminal OUT of the amplifier 191 is taken to be the positive direction for the feedback resistor 192, the leak current Ileak1 in the first phase is a negative current. Therefore, the amplifier 191 outputs an output voltage Vout1 to the light signal calculation unit 195, the output voltage Vout1 being a voltage converted from the combined current of the output current Ip1 and the negative leak current Ileak1.

In the second phase, the light source driving unit 47 of the light-emitting/receiving device 4 supplies a high-potential-side source voltage (an example of a first voltage) VDD having a greater voltage value than the first common voltage Vcom1 to the cathode electrode 112 of the light-emitting element 11. In other words, the light source driving unit 47 operates the switch 473 in such a manner that the high-potential-side source voltage VDD is applied to the terminal 471. The high-potential-side source voltage VDD is thus supplied to the cathode electrode 112 of the light-emitting element 11 through the terminal 471. The first common voltage Vcom1 having a smaller voltage value than the high-potential-side source voltage VDD is applied to the anode electrode 113 of the light-emitting element 11. As a result, a reverse voltage is applied to the light-emitting member 111 of the light-emitting element 11 and the light-emitting element 11 emits no light from the light-emitting member 111. Therefore, the light-receiving member 131 of the light-receiving element 13 outputs no output current produced by light emitted from the light-emitting element 11. Note that, although the first common voltage Vcom1 has been described herein as having a voltage value smaller than the high-potential-side source voltage VDD, the first common voltage Vcom1 may be set at a greater value than the high-potential-side source voltage VDD as long as the value is not greater than the high-potential-side source voltage VDD plus the threshold voltage of the light-emitting element 11. In this case also, it is ensured that the light-emitting member 111 of the light-emitting element 11 emits no light by keeping the difference between the voltage value of the high-potential-side source voltage VDD and the voltage value of the first common voltage Vcom1 smaller than the threshold voltage of the light-emitting element 11.

The high-potential-side source voltage VDD having a greater voltage value than the second common voltage Vcom2 is supplied to the cathode electrode 112 of the light-emitting element 11. Therefore, a leak current Ileak2 flows from the light-emitting element 11 through the parasitic resistance 154 to the light-receiving element 13. Therefore, the amplifier 191 outputs an output voltage Vout2 to the light signal calculation unit 195, the output voltage Vout2 being a voltage converted from the leak current Ileak2.

Similarly to the light-emitting/receiving device 1, the light signal processing unit 19 calculates a light signal based on the output voltage Vout1 in the first phase and the output voltage Vout2 in the second phase.

Similarly to the light-emitting/receiving device 1, the light-emitting/receiving device 4 can thus reduce the effect of the leak current Ileak1 mixing into the output current Ip1 when IV conversion is performed in the light signal processing unit 19, and thereby improve the accuracy in light detection.

In the light-emitting/receiving device 4 according to the present embodiment, if the current value of the leak current Ileak1 in the first phase and the current value of the leak current Ileak2 in the second phase are equal, the voltage corresponding to the leak current Ileak1 is offset by the voltage corresponding to the leak current Ileak2 when the light signal calculation unit 195 adds the output voltage Vout1 and the output voltage Vout2. This enables the light signal calculation unit 195 to output a result of the calculation with high accuracy, based on the output current Ip with the leak current excluded.

It would be ideal if the current value of the leak current Ileak1 and the current value of the leak current Ileak2 were equal because the leak current Ileak1 would be fully offset by the leak current Ileak2. However, it is difficult in practice to make the current value of the leak current Ileak1 and the current value of the leak current Ileak2 equal. In addition, when the absolute value of the current value of the leak current Ileak2 is twice as great as the absolute value of the current value of the leak current Ileak1 or more, the voltage produced by adding the output voltage Vout1 to the output voltage Vout2 contains a voltage equivalent to the voltage that would be produced by IV conversion performed on a leak current Ileak2 having a current value equal to or more than the current value of the leak current Ileak1.

To address this, the light-emitting/receiving device 4 is configured to supply such voltages to the light-emitting element 11 as to satisfy the relation (2B) below, wherein VLED2 is the drive voltage VLED, VLED1 is the high-potential-side source voltage VDD, and Vcom2 is the second common voltage.

$$2\times(V\text{com}2-V\text{LED}2)>(V\text{LED}1-V\text{com}2) \quad (2B)$$

This makes the absolute value of the current value of the leak current Ileak2 smaller than twice the absolute value of the current value of the leak current Ileak1. As a result, the effect of the leak current Ileak1 on the added voltage calculated by the light signal calculation unit 195 is reduced by the leak current Ileak2.

In the light-emitting/receiving device 4 according to the present embodiment, the first voltage applied to the cathode electrode 112 of the light-emitting element 11 in the second phase is the high-potential-side source voltage VDD but the first voltage is not restricted thereto. The first voltage may be a voltage satisfying the relation (3B) below, wherein VLED1 is a first voltage applied to the cathode electrode 112 in the second phase, VLED2 is a second voltage applied to the cathode electrode 112 in the first phase, and Vcom2 is a second common voltage.

$$(V\text{com}2-V\text{LED}1)=(V\text{LED}2-V\text{com}2) \quad (3B)$$

Further, the first voltage may satisfy the relation (4B) below.

$$V\text{LED}1>V\text{com}2>V\text{LED}2 \quad (4B)$$

In the present embodiment, when the relation (2B) and the relation (3B) or relation (4B) are satisfied and the light-emitting element 11 is in the OFF state, a first common voltage Vcom1, for example, that satisfies the relation (1) with respect to the voltage supplied to the cathode electrode 132 of the light-receiving element 13 (the second common voltage Vcom2 in the present embodiment) is applied to both of the anode electrode 113 and the cathode electrode 112 of the light-emitting element 11. The light-emitting/receiving device 4 thereby reduces the effect of leak current in both cases when the light-emitting element 11 is in the OFF state and in the ON state. As a result, the light-emitting/receiving device 4 improves the accuracy in light detection compared with the light-emitting/receiving device 5 according to the reference example, which carries out no particular processing on leak current.

As described above, the light-emitting/receiving device and the light-detecting method according to the present embodiment curtail the deterioration of accuracy in light detection due to leak current. In other words, the light-emitting/receiving device and the light-detecting method according to the present embodiment improve the accuracy in light detection.

In particular, when the light-emitting element 11 is placed in the OFF state, the light-emitting/receiving device 4, instead of setting the cathode electrode 112 of the light-emitting element 11 in a floating state or at the high-potential-side source voltage VDD, sets the anode electrode 113 and the cathode electrode 112 at, for example, the first common voltage Vcom1 that satisfies the relation (1) with respect to the voltage (the second common voltage Vcom2 in the present embodiment) at which the cathode electrode 132 of the light-receiving element 13 is set and which serves as the voltage to be referred to when the light signal processing unit 19 performs IV conversion on the output current Ip inputted thereto from the light-receiving element 13. The light-emitting/receiving device 4 thus curtails the leak currents flowing from the light-emitting element 11 to the light-receiving element 13 and thereby improves the accuracy in light detection.

Although it is recited in the above description that a drive voltage (a second voltage VLED2) is supplied to the cathode electrode 112 of the light-emitting element 11, controlling means for the light-emitting element 11 is not restricted to a voltage supply means.

The effects described above is achieved, for example, by controlling the driving of the light-emitting element 11 by a current supply means (a drive current source) while setting the voltage values of the cathode electrode 112 of the light-emitting element 11 at the above-described voltages. The same applies to other embodiments.

Further, similarly to the first embodiment, the first common voltage value and the second common voltage value in the second phase may be different from the first common voltage value and the second common voltage value in the first phase. In such a case, there may be a phase in which the light-receiving element makes measurement while the light-emitting element is halted by using the first common voltage of the first phase and a phase in which the light-receiving element makes measurement while the light-emitting element is halted by using the first common voltage of the second phase. In such a case, similarly to the case where a single second common voltage Vcom2 is used as described above, the second common voltage in the first phase and the second common voltage of the second phase may be selected in such a manner as to satisfy the relation (5B) or (6B) below, wherein Vcom21 is the second common voltage in the first phase and Vcom22 is the second common voltage in the second phase.

$$V\text{com}21-V\text{LED}1=V\text{LED}2-V\text{com}22 \quad (5B)$$

$$2\times(V\text{com}21-V\text{LED}2)>(V\text{LED}1-V\text{com}22) \quad (6B)$$

Further, the reference voltage for the AD conversion in the subsequent stage in the first phase may be different from that in the second phase.

There are various modifications of above-described embodiments.

In the first to third embodiment described above, the feedback members include a feedback resistor but the feedback members are not restricted thereto. Even when the feedback members include a feedback capacitor, the same effects are produced as that of the light-emitting/receiving device according to the first to third embodiment.

Although the description has been made by using the embodiments above, the technical scope of the disclosure is not restricted to the scope described in the embodiments. It is obvious to those skilled in the art that various alterations or improvements can be made to the above-described embodiments. It is obvious from the appended claims that the embodiments with such modifications or improvements will also fall within the scope of the disclosure.

It should be noted that the processing such as operations, procedures, steps, and stages regarding the devices, systems, programs, and methods described in the claims, the description, and the drawings may be executed in any order unless an order is explicitly specified with phrases such as "before" and "prior to" and unless the output of the previous process is used in the subsequent process. Even when operational processes are described in the claims, in the description, or in the drawings by using phrases such as "first" and "next" for the convenience's sake, it does not mean that the processes have to be followed in the order described.

REFERENCE SIGNS LIST 1, 2, 3, 4, 5 Light-emitting/receiving device
11 Light-emitting element
13 Light-receiving element
15 Semiconductor substrate
17, 27, 57 Light source driving unit
19, 29, 39, 59 Light signal processing unit
111 Light-emitting member
111a, 111b, 131a, 131b Semiconductor layer
112, 132 Cathode electrode
113, 133 Anode electrode
114, 134 Internal resistance of the element
115, 135 Internal diode of the element
131 Light-receiving member
151 Front face
152, 153, 154, 155 Parasitic resistance
156 Back face
171, 172, 193, 194, 271, 272, 293, 294, 396, 397 Terminal
173, 273, 296, 297 Switch
191, 291, 391, 393, 591 Amplifier
192, 292, 392, 394, 592 Feedback resistor
195, 295, 395 Light signal calculation unit
390 Fully differential amplifier

The invention claimed is:

1. A light-emitting/receiving device comprising:
a diode-type light-emitting element formed on a semiconductor substrate;
a diode-type light-receiving element formed on the semiconductor substrate;
a light source driving unit configured to supply a first common voltage to an anode or a cathode of the light-emitting element to drive the light-emitting element; and
a light signal processing unit configured to perform current/voltage conversion on an output current outputted from the light-receiving element, by referring to a second common voltage,
wherein relation (1) is satisfied, wherein Vcom1 is the first common voltage and Vcom2 is the second common voltage:

$$|V\text{com}1 - V\text{com}2| \leq 1 \, [\text{V}] \quad (1).$$

2. A light-emitting/receiving device, comprising:
a diode-type light-emitting element formed on a semiconductor substrate;
a diode-type light-receiving element formed on the semiconductor substrate;
a light source driving unit configured to supply a first common voltage to an anode or a cathode of the light-emitting element to drive the light-emitting element; and
a light signal processing unit configured to perform current/voltage conversion on an output current outputted from the light-receiving element, by referring to a second common voltage,
wherein the light source driving unit is configured:
to supply the first common voltage to the cathode of the light-emitting element;
to supply a first voltage having a greater voltage value than the first common voltage to the anode of the light-emitting element in a first phase; and
to supply a second voltage having a smaller voltage value than the first common voltage to the anode of the light-emitting element in a second phase, and
wherein the light signal processing unit is configured to calculate a light signal based on an output voltage in the first phase and an output voltage in the second phase.

3. The light-emitting/receiving device according to claim 2, wherein relation (2) is satisfied, wherein VLED1 is the first voltage, VLED2 is the second voltage, and Vcom2 is the second common voltage:

$$2 \times (V\text{LED}1 - V\text{com}2) > (V\text{com}2 - V\text{LED}2) \quad (2).$$

4. The light-emitting/receiving device according to claim 2, wherein relation (3) is satisfied, wherein VLED1 is the first voltage, VLED2 is the second voltage, and Vcom2 is the second common voltage:

$$(V\text{LED}1 - V\text{com}2) = (V\text{com}2 - V\text{LED}2) \quad (3).$$

5. The light-emitting/receiving device according to claim 2, wherein the first voltage is a high-potential-side source voltage.

6. The light-emitting/receiving device according to claim 2, wherein the second voltage is a low-potential-side source voltage.

7. A light-emitting/receiving device, comprising:
a diode-type light-emitting element formed on a semiconductor substrate;
a diode-type light-receiving element formed on the semiconductor substrate:
a light source driving unit configured to supply a first common voltage to an anode or a cathode of the light-emitting element to drive the light-emitting element; and
a light signal processing unit configured to perform current/voltage conversion on an output current outputted from the light-receiving element, by referring to a second common voltage,
wherein the light source driving unit is configured:
to supply the first common voltage to the anode of the light-emitting element;
to supply a second voltage having a smaller voltage value than the first common voltage to the cathode of the light-emitting element in a first phase; and
to supply a first voltage having a greater voltage value than the first common voltage to the cathode of the light-emitting element in a second phase, and wherein the light signal processing unit is configured to calculate a light signal based on an output voltage in the first phase and an output voltage in the second phase.

8. The light-emitting/receiving device according to claim 7, wherein relation (2) is satisfied, wherein VLED1 is the first voltage, VLED2 is the second voltage, and Vcom2 is the second common voltage:

$$2\times(V\text{LED}1-V\text{com}2)>(V\text{com}2-V\text{LED}2) \quad (2).$$

\* \* \* \* \*